US012588383B2

(12) United States Patent
Hong et al.

(10) Patent No.: US 12,588,383 B2
(45) Date of Patent: Mar. 24, 2026

(54) DISPLAY PANEL

(71) Applicant: Samsung Display Co., Ltd., Yongin-Si (KR)

(72) Inventors: Jongbeom Hong, Yongin-si (KR); Yongsub Shim, Yongin-si (KR); Younho Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 636 days.

(21) Appl. No.: 17/718,581

(22) Filed: Apr. 12, 2022

(65) Prior Publication Data

US 2023/0099374 A1     Mar. 30, 2023

(51) Int. Cl.
| | |
|---|---|
| *H10K 59/35* | (2023.01) |
| *B60K 35/22* | (2024.01) |
| *B60K 35/40* | (2024.01) |
| *B60K 35/81* | (2024.01) |
| *H10K 59/80* | (2023.01) |
| *H10K 59/122* | (2023.01) |
| *H10K 59/123* | (2023.01) |
| *H10K 59/38* | (2023.01) |

(52) U.S. Cl.
CPC ........... *H10K 59/352* (2023.02); *B60K 35/22* (2024.01); *B60K 35/425* (2024.01); *B60K 35/81* (2024.01); *H10K 59/8792* (2023.02); *H10K 59/122* (2023.02); *H10K 59/123* (2023.02); *H10K 59/38* (2023.02)

(58) Field of Classification Search
CPC ... H10K 50/865; H10K 59/122; H10K 59/352
See application file for complete search history.

(56) References Cited

U.S. PATENT DOCUMENTS

| | | |
|---|---|---|
| 8,213,082 B2 | 7/2012 | Gaides et al. |
| 8,395,308 B2 | 3/2013 | Asaki |
| 11,075,364 B2 | 7/2021 | Kim et al. |
| (Continued) | | |

FOREIGN PATENT DOCUMENTS

| | | |
|---|---|---|
| KR | 10-1546554 B1 | 9/2010 |
| KR | 1020110018831 A | 2/2011 |
| (Continued) | | |

OTHER PUBLICATIONS

Adjacent. (n.d.) Merriam-Webster Dictionary. Retrieved Jul. 14, 2025 from https://www.merriam-webster.com/dictionary/adjacent (Year: NA) (Year: 2025).*

*Primary Examiner* — Eliseo Ramos Feliciano
*Assistant Examiner* — Mikka Liu
(74) *Attorney, Agent, or Firm* — Innovation Counsel LLP

(57)     ABSTRACT

A display panel is disclosed that includes a substrate, a first light blocking line, a second light blocking line, and a third light blocking line located on the substrate. The first, second, and third light blocking lines extend in a first direction in a plan view, and are spaced apart from one another in a second direction that intersects the first direction. A first display element and a second display element are located between the first light blocking line and the second light blocking line and respectively emit light of a first color and light of a second color. A third display element is located between the second light blocking line and the third light blocking line and emits light of a third color.

20 Claims, 19 Drawing Sheets

(56)     References Cited

U.S. PATENT DOCUMENTS

| | | |
|---|---|---|
| 2018/0308915 A1 | 10/2018 | Motoyama et al. |
| 2019/0049779 A1* | 2/2019 | Lee .......................... G02B 5/22 |
| 2020/0168844 A1* | 5/2020 | Kim ....................... H10K 59/12 |
| 2020/0212113 A1* | 7/2020 | Song .................... H10K 59/122 |
| 2021/0005846 A1 | 1/2021 | Kim et al. |
| 2021/0031626 A1 | 2/2021 | Kim et al. |

FOREIGN PATENT DOCUMENTS

| | | |
|---|---|---|
| KR | 1020150019347 A | 2/2015 |
| KR | 10-2015-0091981 A | 8/2015 |
| KR | 10-2020-0063591 A | 6/2020 |
| KR | 10-2021-0016222 A | 2/2021 |

* cited by examiner

DISPLAY PANEL

CROSS-REFERENCE TO RELATED APPLICATION

This application is based on and claims priority under 35 U.S.C. § 119 to Korean Patent Application No. 10-2021-0119100, filed on Sep. 7, 2021, in the Korean Intellectual Property Office, the disclosure of which is incorporated by reference herein in its entirety.

BACKGROUND

1. Field

The present inventive concept relates to a display panel.

2. Description of the Related Art

Recently, display apparatuses have been used for various purposes. Also, as the display apparatuses have become thinner and lighter, the range of applications has increased, and as the display apparatuses have been used in various fields, the demand for display apparatuses for providing high-quality images keeps increasing.

Recently, display apparatuses are mounted in vehicles to provide images to users in driver seats or passenger seats. Light reflected from a display apparatus mounted in a vehicle may be reflected by a front window glass or a side window glass of the vehicle to a user, and the user may see that an image provided by the display apparatus is formed on the front window glass or the side window glass. When the user is a driver, the driver's vision may be obstructed during driving, which presents a safety problem.

SUMMARY

Additional aspects will be set forth in part in the description which follows and, in part, will be apparent from the description, or may be learned by practice of the presented embodiments.

According to an embodiment, a display panel includes a substrate, a first light blocking line, a second light blocking line, and a third light blocking line located on the substrate, extending in a first direction in a plan view, and spaced apart from one another in a second direction that intersects the first direction, a first display element and a second display element located between the first light blocking line and the second light blocking line and respectively emitting light of a first color and light of a second color, and a third display element located between the second light blocking line and the third light blocking line and emitting light of a third color, wherein, in a plan view, a first width of each of a first emission area of the first display element, a second emission area of the second display element, and a third emission area of the third display element in the first direction is greater than a second width of each of the first emission area of the first display element, the second emission area of the second display element, and the third emission area of the third display element in the second direction.

The second widths of the first emission area, the second emission area, and the third emission area in the second direction may be same.

When viewed from a user's viewpoint, the first direction may be a row direction and the second direction may be a column direction.

The display panel may further include a light blocking control layer located over the first display element, the second display element, and the third display element, wherein the light blocking control layer includes a plurality of light blocking pattern layers; and a plurality of insulating layers alternately located with the plurality of light blocking pattern layers.

The plurality of insulating layers may include a light-transmitting organic material.

A thickness of the light blocking control layer may be proportional to the second width.

The plurality of light blocking pattern layers may respectively include openings corresponding to the first emission area, the second emission area, and the third emission area, wherein two adjacent insulating layers from among the plurality of insulating layers contact each other through the opening.

In a plan view, a shape of each of the first emission area, the second emission area, and the third emission area may be a quadrangular shape.

The first color may be red, the second color may be green, and the third color may be blue.

In a plan view, a size of the third emission area may be greater than a size of the first emission area and a size of the second emission area.

The display panel may further include a fourth light blocking line and a fifth light blocking line extending in the first direction and spaced apart from the third light blocking line in the second direction, a fourth display element and a fifth display element located between the third light blocking line and the fourth light blocking line and respectively emitting light of the first color and light of the second color, and a sixth display element located between the fourth light blocking line and the fifth light blocking line and emitting light of the third color.

The display panel may further include a first pixel circuit, a second pixel circuit, and a third pixel circuit located on the substrate, wherein the first pixel circuit is electrically connected to the first display element and the fourth display element, the second pixel circuit is electrically connected to the second display element and the fifth display element, and the third pixel circuit is electrically connected to the third display element and the sixth display element.

The fourth display element may be controlled in a same manner as the first display element, the fifth display element may be controlled in a same manner as the second display element, and the sixth display element may be controlled in a same manner as the third display element.

In a plan view, a third width of each of a fourth emission area of the fourth display element, a fifth emission area of the fifth display element, and a sixth emission area of the sixth display element in the first direction may be greater than a fourth width of each of the fourth emission area of the fourth display element, the fifth emission area of the fifth display element, and the sixth emission area of the sixth display element in the second direction.

The second width and the fourth width may be same.

The display panel may further include a light blocking control layer located over the first display element through the sixth display element, wherein the light blocking control layer includes a plurality of light blocking pattern layers; and a plurality of insulating layers alternately located with the plurality of light blocking pattern layers, wherein the first light blocking line through the fifth light blocking line respectively correspond to at least some of the plurality of light blocking pattern layers.

A thickness of the light blocking control layer may be proportional to the fourth width.

The display panel may further include a thin film encapsulation layer located on the first display element, the second display element, and the third display element, and an anti-reflection layer located on the light blocking control layer.

The light blocking control layer may be located on the thin film encapsulation layer.

A viewing angle of light emitted by each of the first display element, the second display element, and the third display element may be equal to or less than 30°.

Other aspects, features, and advantages of the disclosure will become more apparent from the drawings, the claims, and the detailed description.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
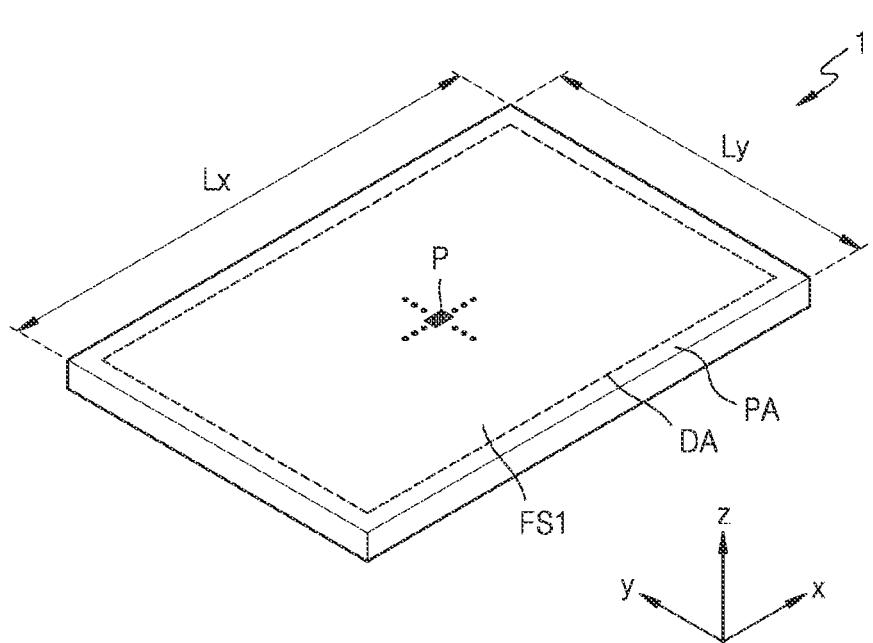
FIG. 1 is a perspective view illustrating a display apparatus, according to an embodiment.

Embodiments of the present inventive concept include a display panel in which, when the display panel is mounted on a means of transportation such as a vehicle, emitted light may travel within a specific viewing angle.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B."

Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

While such terms as "first," "second," etc., may be used to describe various components, such components are not be limited to the above terms. The above terms are used only to distinguish one component from another.

In the following embodiments, an expression used in the singular encompasses the expression of the plural, unless it has a clearly different meaning in the context.

In the following embodiments, it is to be understood that the terms "including," "having," and "comprising" are intended to indicate the existence of features or components described in the specification, and are not intended to preclude the possibility that one or more other features or components may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

It will be understood that when a layer, an area, or an element is referred to as being "connected" to another layer, area, or element, it may be "directly connected" to the other layer, area, or element or it may be "indirectly connected" to the other layer, area, or element with other layers, areas, or elements interposed therebetween. For example, when a layer, an area, or an element is referred to as being "electrically connected," it may be directly electrically connected, or it may be indirectly electrically connected with intervening layers, areas, or elements therebetween.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be different from the described order. For example, two consecutively described processes may be performed substantially at the same time or may be performed in an order opposite to the described order.

Sizes of components in the drawings may be exaggerated or contracted for convenience of explanation. For example, because sizes and thicknesses of elements in the drawings are arbitrarily illustrated for convenience of explanation, the disclosure is not limited thereto.

FIG. 1 is a perspective view illustrating a display apparatus 1, according to an embodiment.

Referring to FIG. 1, the display apparatus 1 may include a display area DA and a peripheral area PA. A sub-pixel P may be located in the display area DA. In an embodiment, the sub-pixel P may be located on a front surface FS1 of the display apparatus 1.

In an embodiment, a plurality of sub-pixels P may be located in the display area DA. The sub-pixel P may be implemented as a display element. The display apparatus 1 may provide an image by using light emitted by the sub-pixel P.

Light emitted by the sub-pixel P may travel in a specific direction from the front surface FS1 of the display apparatus 1. Light emitted by the sub-pixel P may not travel in another specific direction from the front surface FS1 of the display apparatus 1. In an embodiment, light emitted by the sub-pixel P may travel in a direction perpendicular to the front surface FS1 of the display apparatus 1 (e.g., a +z direction). Light emitted by the sub-pixel P may travel in a direction oblique to the front surface FS1 of the display apparatus 1 (e.g., a direction intersecting the +z direction).

In an embodiment, the sub-pixel P may emit red light, green light, or blue light by using a display element. In an embodiment, the sub-pixel P may emit red light, green light, blue light, or white light by using a display element. In an embodiment, the sub-pixel P may be defined as an emission area of a display element that emits light of a color from among red, green, blue, and white.

In an embodiment, the sub-pixel P may include a light-emitting diode as a display element capable of emitting light of a certain color. The light-emitting diode may include an organic light-emitting diode including an organic material as an emission layer. Alternatively, the light-emitting diode may include an inorganic light-emitting diode. Alternatively, the light-emitting diode may include quantum dots as an emission layer. In an embodiment, the light-emitting diode may have a micro-scale or nano-scale size. For example, the light-emitting diode may be a micro light-emitting diode. Alternatively, the light-emitting diode may be a nano light-emitting diode. The nano light-emitting diode may include gallium nitride (GaN). In an embodiment, a color conversion layer may be located on the nano light-emitting diode. The color conversion layer may include quantum dots. For convenience of explanation, the following will be described assuming that the light-emitting diode includes an organic light-emitting diode.

The peripheral area PA may be an area where an image is not provided. The peripheral area PA may at least partially surround the display area DA. In an embodiment, the peripheral area PA may entirely surround the display area DA. A driver or the like for applying an electrical signal or power to the sub-pixel P may be located in the peripheral area PA. Also, the peripheral area PA ma include a pad area where a pad is located.

The display apparatus 1 may include edges. In an embodiment, the display apparatus 1 may include at least one edge. For example, the display apparatus 1 may have a polygonal shape. As another example, the display apparatus 1 may have a circular shape or an elliptical shape. As another example, the edge of the display apparatus 1 may be curved.

The following will be described in detail assuming that the display apparatus 1 has a quadrangular shape.

The display apparatus 1 may include a first edge Lx and a second edge Ly. The first edge Lx may be an edge of the display apparatus 1 extending in an x direction or a −x direction of FIG. 1. The second edge Ly may be an edge of the display apparatus 1 extending in a y direction or a −y direction of FIG. 1. In an embodiment, the first edge Lx and the second edge Ly may have different lengths. For example, the first edge Lx may be longer than the second edge Ly. In another example, the first edge Lx may be shorter than the second edge Ly. In another embodiment, the first edge Lx and the second edge Ly may have the same length.

Figure 2A:
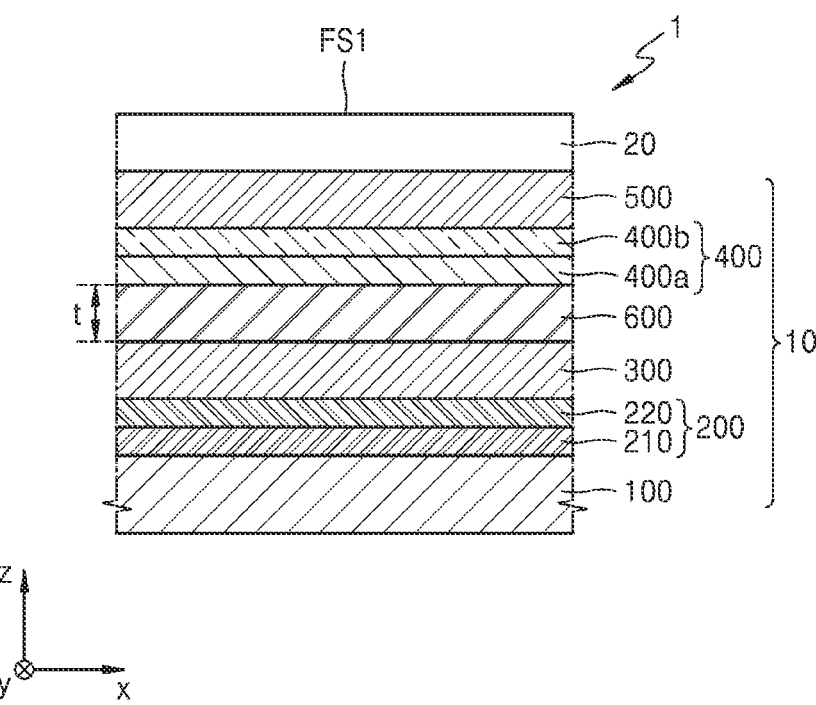
FIGS. 2A and 2B are cross-sectional views illustrating a display apparatus, according to an embodiment.
Figure 2B:
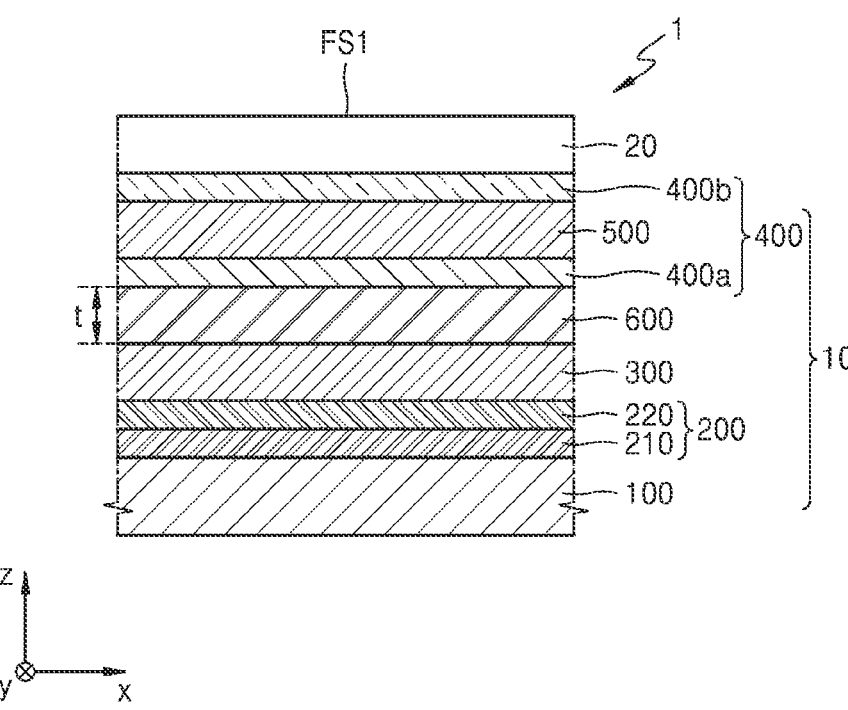

FIGS. 2A and 2B are cross-sectional views illustrating the display apparatus 1, according to an embodiment.

Referring to FIGS. 2A and 2B, the display apparatus 1 may include a display panel 10 and a cover window 20. The display panel 10 may include a substrate 100, a display layer 200, an encapsulation layer 300, a functional layer 400, and an anti-reflection layer 500.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the substrate 100 may have a multi-layer structure including a base layer including the polymer resin and a barrier layer (not shown). The substrate 100 including the polymer resin may be flexible, rollable, or bendable.

The display layer 200 may be located on the substrate 100. The display layer 200 may include a pixel circuit layer 210 and a display element layer 220. The pixel circuit layer 210 may include pixel circuits. The display element layer 220 may include a plurality of display elements respectively connected to the plurality of pixel circuits. Each of the display elements provided in the display element layer 220 may define a sub-pixel. The pixel circuit layer 210 may include a plurality of thin-film transistors and a plurality of storage capacitors.

The encapsulation layer 300 may be located on the display layer 200. In an embodiment, the encapsulation layer 300 may include at least one inorganic encapsulation layer and at least one organic encapsulation layer. The at least one inorganic encapsulation layer may include at least one inorganic material from among aluminum oxide ($Al_2O_3$), titanium oxide ($TiO_2$), tantalum oxide ($Ta_2O_5$), zinc oxide ($ZnO_x$) (e.g., ZnO or $ZnO_2$), silicon oxide ($SiO_2$), silicon nitride ($SiN_x$), and silicon oxynitride (SiON). The at least one organic encapsulation layer may include a polymer-based material. Examples of the polymer-based material may include an acrylic resin, an epoxy resin, polyimide, and polyethylene. In an embodiment, the at least one organic encapsulation layer may include acrylate.

In another embodiment, the encapsulation layer 300 may have a structure in which the substrate 100 and an upper substrate that is a transparent member are coupled to each other by a sealing member to seal an inner space between the substrate 100 and the upper substrate. In this case, a moisture absorbent or a filler may be located in the inner space. The sealing member may be a sealant. In another embodiment, the sealing member may include a material that is cured by a laser. For example, the sealing member may be a frit. Specifically, the sealing member may include a urethane resin, an epoxy resin, or an acrylic resin that is an organic sealant, or silicone that is an inorganic sealant. Examples of the urethane resin may include urethane acrylate. Examples of the acrylic resin may include butyl acrylate and ethyl-hexyl acrylate. The sealing member may include a material that is cured by heat.

A light blocking control layer 600 may be located on the encapsulation layer 300. The light blocking control layer 600 may have a shape in which a plurality of light blocking patterns and a plurality of insulating layers are alternately stacked. In an embodiment, the plurality of light blocking patterns may be a black matrix. The plurality of insulating layers may include a light-transmitting organic material, for example, an acrylic resin, an epoxy resin, polyimide, or polyethylene.

The light blocking control layer 600 may have a thickness t ranging from tens of μm to hundreds of μm. In an embodiment, the thickness t of the light blocking control layer 600 may range from about 50 μm to about 150 μm. Only when the thickness t of the light blocking control layer 600 is a certain distance or more, light emitted by a display element (e.g., an organic light-emitting diode) may be emitted at a specific viewing angle, which will be described below in detail with reference to FIG. 5.

The functional layer 400 may be located on the encapsulation layer 300. The functional layer 400 may include a first layer 400a and a second layer 400b. In an embodiment, at least one of the first layer 400a and the second layer 400b may include a touch sensor layer. The touch sensor layer for sensing a user's touch input may detect the user's touch input by using at least one of various touch methods such as a low resistive method and a capacitive method. In an embodiment, at least one of the first layer 400a and the second layer 400b may include an optical layer. In an embodiment, the optical layer may be a layer having a structure for adjusting a direction of light emitted by display elements.

In an embodiment, the functional layer 400 may be provided so that some elements of the touch sensor layer and some elements of the optical layer are shared with each other. That is, the functional layer 400 may be a touch sensor layer for sensing a touch input and may be an optical layer for improving optical performance.

Referring to FIG. 2A, the anti-reflection layer 500 may be located on the functional layer 400. The anti-reflection layer 500 may reduce a reflectance of light (external light) incident on the display panel 10.

In an embodiment, the anti-reflection layer 500 may be provided as a polarizing film. The polarizing film may include a linear polarizer and a phase retardation film such as a quarter-wave (λ/4) film. The phase retardation film may be located on the functional layer 400, and the linear polarizing film may be located on the phase retardation film.

In an embodiment, the anti-reflection layer 500 may include a filter layer including color filters or a light blocking layer. The color filters may be arranged in consideration of a color of light emitted by each of sub-pixels of the display panel 10. For example, the filter layer may include a red, green, or blue color filter.

In an embodiment, when the anti-reflection layer 500 includes color filters and a light blocking layer, the anti-reflection layer 500 may be located between the first layer 400a and the second layer 400b as shown in FIG. 2B. In this case, elements of the anti-reflection layer 500 and elements of the optical layer may be at least partially shared with each other.

The cover window 20 may be located on the display panel 10. In an embodiment, the cover window 20 may be coupled to at least one of elements, for example, the anti-reflection layer 500 and the functional layer 400, located under the cover window 20 through an adhesive such as an optically clear adhesive (OCA). The cover window 20 may protect the display panel 10. The cover window 20 may include at least one of glass, sapphire, and plastic. The cover window 20 may include, for example, ultra-thin glass (UTG) or colorless polyimide (CPI).

Figure 3:
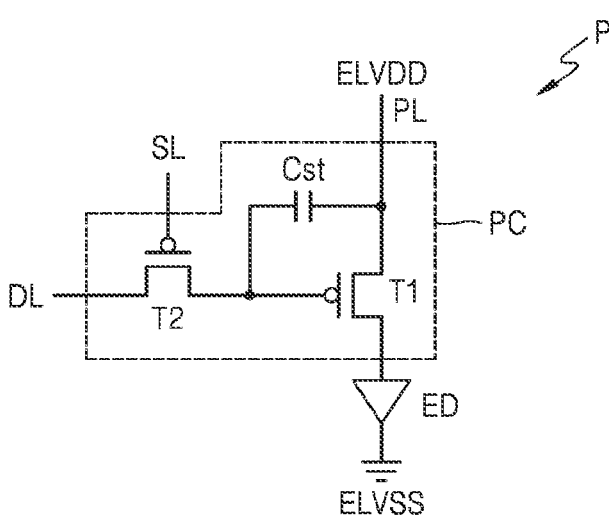
FIG. 3 is an equivalent circuit diagram of a sub-pixel included in a display apparatus, according to an embodiment.

FIG. 3 is an equivalent circuit diagram of a sub-pixel included in a display apparatus, according to an embodiment.

Referring to FIG. 3, the sub-pixel P may include a pixel circuit PC, and a light-emitting diode ED (e.g., an organic light-emitting diode OLED) as a display element.

The pixel circuit PC may include a driving thin-film transistor T1, a switching thin-film transistor T2, and a storage capacitor Cst. Each sub-pixel P may emit, for example, red light, green light, or blue light, or may emit red light, green light, blue light, or white light, through the light-emitting diode ED.

The switching thin-film transistor T2 may be connected to a scan line SL and a data line DL, and may transmit a data signal or a data voltage input from the data line DL to the driving thin-film transistor T1 based on a scan signal or a switching voltage input from the scan line SL. The storage capacitor Cst may be connected to the switching thin-film transistor T2 and a driving voltage line PL, and may store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may control driving current flowing through the light-emitting diode ED from the driving voltage line PL in response to a value of the voltage stored in the storage capacitor Cst. The light-emitting diode ED may emit light having a certain luminance according to the driving current. A common electrode (e.g., a cathode) of the light-emitting diode ED may receive a second power supply voltage ELVSS.

The pixel circuit PC of FIG. 3 is merely an example, and various modifications may be made. For example, in another embodiment, the pixel circuit PC may include 7 thin-film transistors and 1 storage capacitor, or may include 3 thin-film transistors and 1 storage capacitor.

Figure 4:
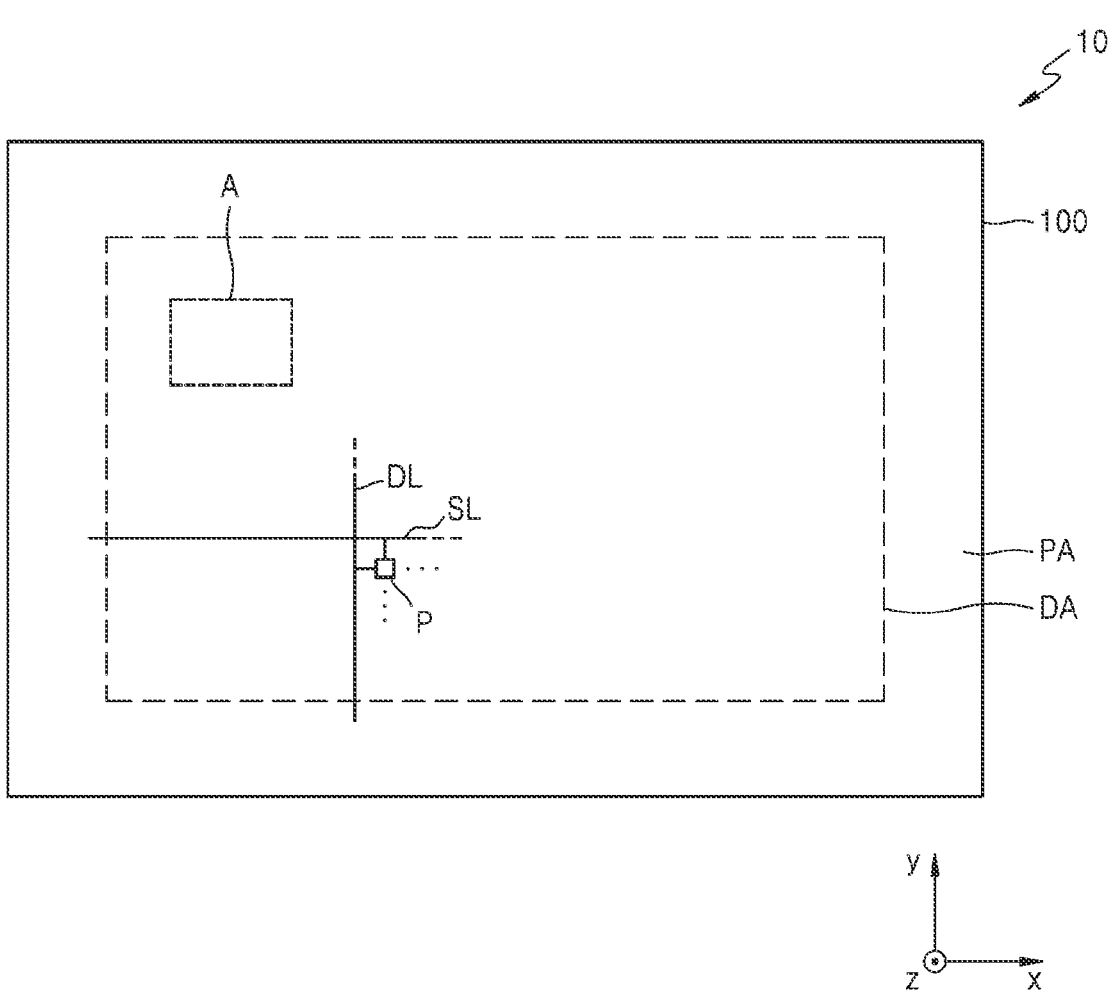
FIG. 4 is a plan view illustrating a display panel, according to an embodiment.

FIG. 4 is a plan view illustrating the display panel 10, according to an embodiment.

Referring to FIG. 4, the display panel 10 may include the substrate 100 and a plurality of layers on the substrate 100. The display area DA and the peripheral area PA may be defined on the substrate 100 or the multiple layers. For example, the substrate 100 may include the display area DA and the peripheral area PA. The following will be described assuming that the display area DA and the peripheral area PA are defined on the substrate 100.

The sub-pixel P may be located in the display area DA, and a plurality of sub-pixels P may display an image. Each of the sub-pixels P may be connected to the scan line SL extending in the first direction (e.g., the x direction or the −x direction) and the data line DL extending in the second direction (e.g., the y direction or the −y direction).

The peripheral area PA may be located outside the display area DA. The peripheral area PA may at least partially surround the display area DA. In an embodiment, the peripheral area PA may entirely surround the display area DA. A scan driver (not shown) for applying a scan signal to each sub-pixel P may be located in the peripheral area PA. A data driver for applying a data signal to the sub-pixel P may be located in the peripheral area PA. The peripheral area PA may include a pad area (not shown). In an embodiment, a pad (not shown) may be located in the pad area. The pad may be exposed without being covered by an insulating layer, and may be electrically connected to a printed circuit board or a driver integrated circuit (IC). Signals or voltages received from the printed circuit board or the driver IC through the pad may be transmitted to the sub-pixel P located in the display area DA through a wiring (not shown) connected to the pad.

Figure 5:
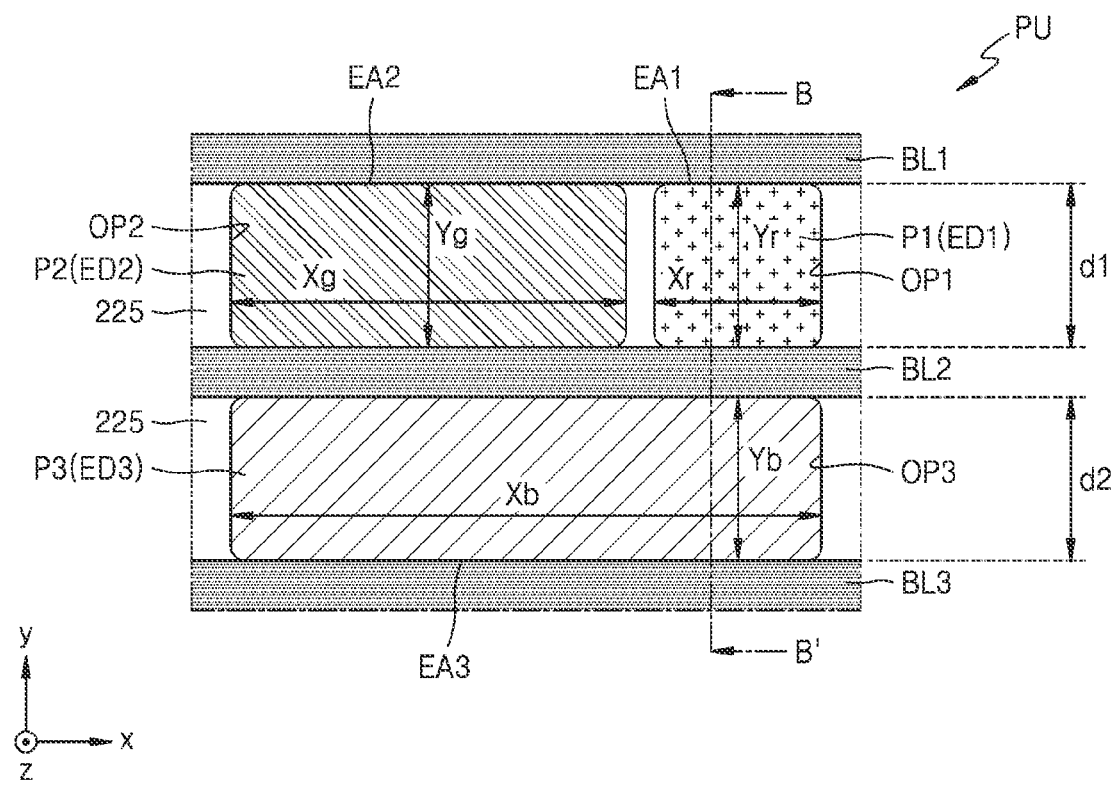
FIG. 5 is an enlarged plan view illustrating a portion A of a display area of the display panel of FIG. 4.

FIG. 5 is an enlarged plan view illustrating a portion A of the display area DA of the display panel of FIG. 4.

Referring to FIG. 5, the display panel 10 includes a first light blocking line BL1, a second light blocking line BL2, and a third light blocking line BL3 which extend in one direction, and a first sub-pixel P1 including a first display element, a second sub-pixel P2 including a second display element, and a third sub-pixel P3 including a third display element which are located between the first through third light blocking lines BL1, BL2, and BL3. In an embodiment, the first sub-pixel P1, the second sub-pixel P2, and the third sub-pixel P3 may emit light having different wavelengths, and may constitute one pixel unit PU.

The first sub-pixel P1 may have a first width Xr extending in the first direction (e.g., the x direction) and a second width Yr extending in the second direction (e.g., the y direction). The first width Xr and the second width Yr of the first sub-pixel P1 may refer to the first width Xr and the second width Yr of a first emission area EA1 of the first sub-pixel P1. In an embodiment, the first width Xr may be greater than the second width Yr. When viewed from a user's viewpoint, the first width Xr may correspond to a horizontal direction, and the second width Yr may correspond to a vertical direction. That is, the width of the first sub-pixel P1 in the horizontal direction may be greater than that in the vertical direction. The horizontal direction and the vertical direction of the first sub-pixel P1 should be considered in association with the user's viewpoint and perception direction, because they are related to a viewing angle described below.

In an embodiment, the first sub-pixel P1 may have a rectangular shape. In another embodiment, the first sub-pixel P1 may have a polygonal shape or a circular shape, and even in this case, the width of the first sub-pixel 1 in the horizontal direction may be greater than that in the vertical direction.

In an embodiment, the first direction (e.g., the x direction) and the second direction (e.g., the y direction) may intersect each other. For example, the first direction (e.g., the x direction) and the second direction (e.g., the y direction) may have an acute angle, a right angle, or an obtuse angle therebetween. For example, the first direction (e.g., the x direction) may be the x direction or the −x direction. The second direction (e.g., the y direction) may be the y direction or the −y direction. The following will be described in detail assuming that the first direction (e.g., the x direction) and the second direction (e.g., the y direction) are perpendicular to each other.

In an embodiment, a size of the first sub-pixel P1 may be defined as a size of the first emission area EA1 of a first light-emitting diode ED1 as a first display element. The first emission area EA1 may be defined through a first opening OP1 of a pixel-defining film 225, and may be an area where the first light-emitting diode ED1 emits light. In this case, the first width Xr and the second width Yr of the first sub-pixel P1 may be respectively a long side and a short side of the first light emitting area EA1.

In an embodiment, the first light-emitting diode ED1 may be a red organic light-emitting diode. The first emission area EA1 of the first light-emitting diode ED1 may emit light of a red wavelength band. Accordingly, the first sub-pixel P1 may be a red sub-pixel.

The second sub-pixel P2 may have a first width Xg extending in the first direction (e.g., the x direction) and a second width Yg extending in the second direction (e.g., the y direction). In this case, the first width Xg and the second width Yg may refer to the first width Xg and the second width Yg of a second emission area EA2 of the second sub-pixel P2. In an embodiment, the first width Xg may be greater than the second width Yg. When viewed from the user's viewpoint, the first width Xg may correspond to the horizontal direction and the second width Yg may correspond to the vertical direction. That is, the width of the second sub-pixel P2 in the horizontal direction may be greater than that in the vertical direction. The horizontal direction and the vertical direction of the second sub-pixel P2 should be considered in association with the user's viewpoint and perception direction, because they are related to a viewing angle described below.

In an embodiment, the second sub-pixel P2 may have a rectangular shape. In another embodiment, the second sub-pixel P2 may have a polygonal shape or a circular shape, and even in this case, the width of the second sub-pixel P2 in the horizontal direction may be greater than that in the vertical direction.

In an embodiment, a size of the second sub-pixel P2 may be defined as a size of the second emission area EA2 of a second light-emitting diode ED2 as a second display element. The second emission area EA2 may be defined through an opening OP2 of the pixel-defining film 225, and may be an area where the second light-emitting diode ED2 emits light. In this case, the first width Xg and the second width Yg of the second sub-pixel P2 may be respectively a long side and a short side of the second emission area EA2.

In an embodiment, the second light-emitting diode ED2 may be a green organic light-emitting diode. The second emission area EA2 of the second light-emitting diode ED2 may emit light of a green wavelength band. Accordingly, the second sub-pixel P2 may be a green sub-pixel.

The third sub-pixel P3 may have a first width Xb extending in the first direction (e.g., the x direction) and a second width Yb extending in the second direction (e.g., the y direction). In this case, the first width Xb and the second width Yb may refer to the first width Xb and the second width Yb of a third emission area EA3 of the third sub-pixel P3. In an embodiment, the first width Xb may be greater than the second width Yb. When viewed from the user's viewpoint, the first width Xb may correspond to the horizontal direction, and the second width Yb may correspond to the vertical direction. That is, the width of the third sub-pixel P3 in the horizontal direction may be greater than that in the vertical direction. The horizontal direction and the vertical direction of the third sub-pixel P3 should be considered in association with the user's viewpoint and perception direction, because they are related to a viewing angle described below.

In an embodiment, the third sub-pixel P3 may have a rectangular shape. In another embodiment, the third sub-pixel P3 may have a polygonal shape or a circular shape, and even in this case, the width of the third sub-pixel P3 in the horizontal direction may be greater than that in the vertical direction.

In an embodiment, a size of the third sub-pixel P3 may be defined as a size of the third emission area EA3 of a third light-emitting diode ED3 as a third display element. In an embodiment, the third emission area EA3 of the third sub-pixel P3 may be larger than the first emission area EA1 of the first sub-pixel P1 and the second emission area EA2 of the second sub-pixel P2. The third emission area EA3 may be defined through an opening OP3 of the pixel-defining film 225, and may be an area where the third light-emitting diode ED3 emits light. In this case, the first width Xb and the second width Yb of the third sub-pixel P3 may be respectively a long side and a short side of the third emission area EA3.

In an embodiment, the third light-emitting diode ED3 may be a blue organic light-emitting diode. The third emission area EA3 of the third light-emitting diode ED3 may emit light of a blue wavelength band. Accordingly, the first sub-pixel P1 may be a blue sub-pixel.

In a plan view, the first light blocking line BL1, the second light blocking line BL2, and the third light blocking line BL3 may extend in the first direction (e.g., the x direction). Also, in a plan view, the first light blocking line BL1, the second light blocking line BL2, and the third light blocking line BL3 may be spaced apart from one another in the second direction (e.g., the y direction) that intersects the first direction (e.g., the x direction). The term 'plan view' used herein may refer to a view of an x-y plane of the substrate 100.

The first sub-pixel P1, the second sub-pixel P2, and the third sub-pixel P3 may be located between the first light blocking line BL1, the second light blocking line BL2, and the third light blocking line BL3 that are spaced apart from one another. Although one pixel unit PU is illustrated in FIG. 5, the first light blocking line BL1, the second light blocking line BL2, and the third light blocking line BL3 may continuously extend in the first direction (e.g., the x direction). Lengths of the first light blocking line BL1, the second light blocking line BL2, and the third light blocking line BL3 may correspond to a horizontal width Ix of the display area DA of FIG. 4. The first sub-pixel P1, the second sub-pixel P2, and the third sub-pixel P3 may be continuously located between the first light blocking line BL1, the second light blocking line BL2, and the third light blocking line BL3.

In an embodiment, the first sub-pixel P1 and the second sub-pixel P2 may be located between the first light blocking line BL1 and the second light blocking line BL2. Also, the third sub-pixel P3 may be located between the second light blocking line BL2 and the third light blocking line BL3. That is, the first sub-pixel P1 and the second sub-pixel P2 may be arranged in the same row, and the third sub-pixel P3 may be located in a row different from the first sub-pixel P1 and the second sub-pixel P2.

In an embodiment, the second width Yr of the first sub-pixel P1, the second width Yg of the second sub-pixel P2, and the second width Yb of the third sub-pixel P3 may be the same. As such, when the second width Yr of the first sub-pixel P1, the second width Yg of the second sub-pixel P2, and the second width Yb of the third sub-pixel P3 are the same, the first through third sub-pixels P1, P2, and P3 may have the same viewing angle and may have the same luminance reduction rate, thereby maintaining or improving uniform white angle difference (WAD) quality.

When the second width Yr of the first sub-pixel P1, the second width Yg of the second sub-pixel P2, and the second width Yb of the third sub-pixel P3 are the same, it may be interpreted that a distance d1 between the first light blocking line BL1 and the second light blocking line BL2 and a distance d2 between the second light blocking line BL2 and the third light blocking line BL3 are the same. However, this may be established when the second width Yr of the first emission area EA1, the second width Yg of the second emission area EA2, and the third width Yb of the third emission area EA3 respectively determining the second width Yr of the first sub-pixel P1, the second width Yg of the second sub-pixel P2, and the second width Yb of the third sub-pixel P3 are the same as the distance d1 between the first light blocking line BL1 and the second light blocking line BL2 and the distance d2 between the second light blocking line BL2 and the third light blocking line BL3. That is, an aperture ratio of the first emission area EA1, the second emission area EA2, and the third emission area EA3 in the second direction (e.g., the y direction) may be the same as the distance d1 between the first light blocking line BL1 and the second light blocking line BL2 and the distance d2 between the second light blocking line BL2 and the third light blocking line BL3.

As a comparative example, it may be assumed that a second width of a first sub-pixel and a second width of a second sub-pixel are the same and a second width of a third sub-pixel is different from them. When the second width of the third sub-pixel is greater or less than the second width of the first sub-pixel or the second width of the second sub-pixel, a viewing angle of the third sub-pixel may be less or greater than a viewing angle of the first sub-pixel and the second sub-pixel. That is, because a luminance reduction rate of the third sub-pixel and a luminance reduction rate of the first sub-pixel and the second sub-pixel are different from each other, WAD quality may be degraded.

Accordingly, in the display panel 10 according to an embodiment, because the second width Yr of the first sub-pixel P1, the second width Yg of the second sub-pixel P2, and the second width Yb of the third sub-pixel P3 are the same, the first through third sub-pixels P1, P2, and P3 may have the same viewing angle and the same luminance reduction rate, thereby maintaining or improving uniform WAD quality.

Figure 6:
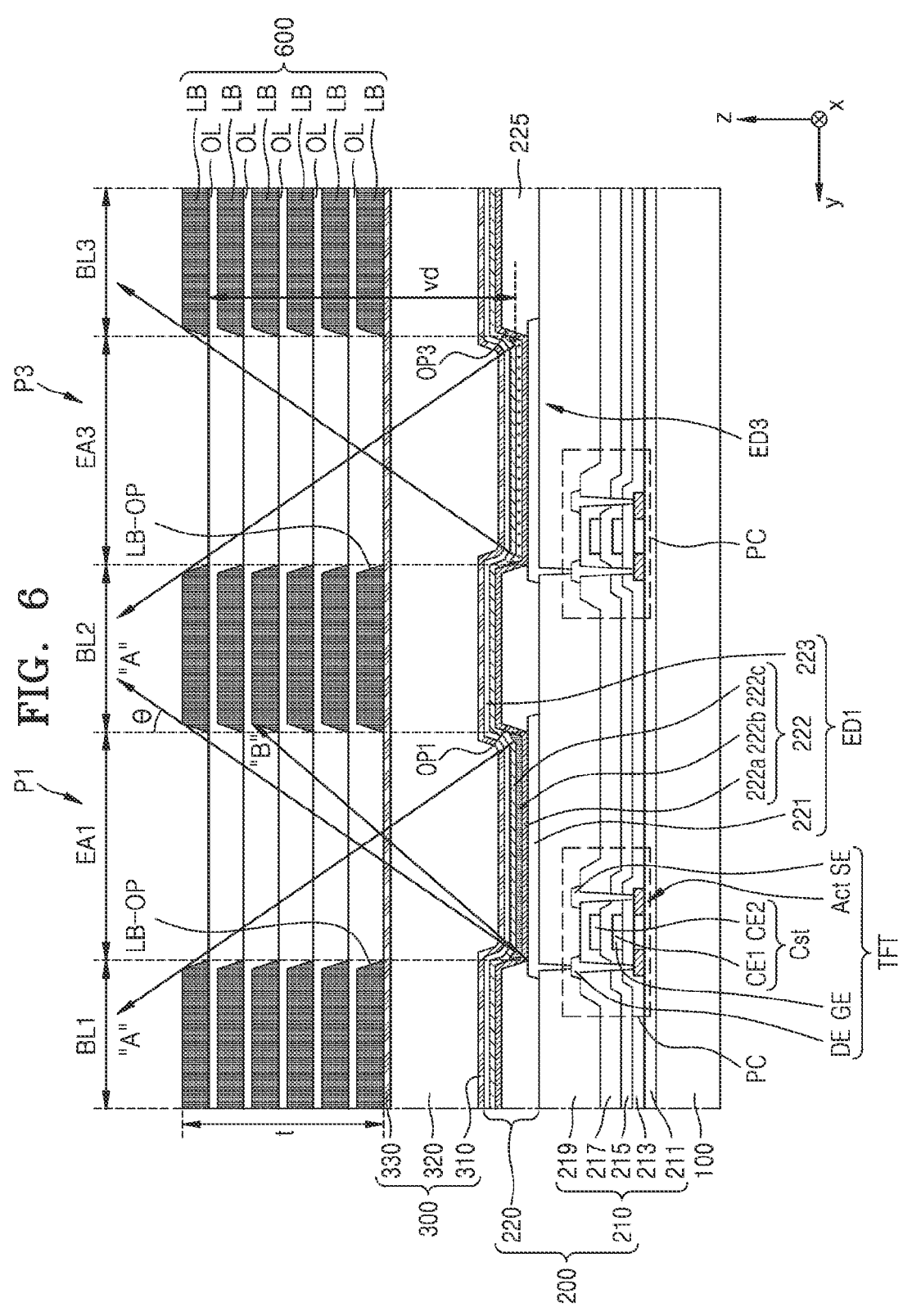
FIG. 6 is a cross-sectional view taken along line B-B' of the display panel of FIG. 5.

FIG. 6 is a cross-sectional view taken along line B-B' of the display panel of FIG. 5.

Referring to FIG. 6 together with FIG. 5, the display panel 10 may include the substrate 100, the display layer 200, the encapsulation layer 300, and the light blocking control layer 600. Although not shown in FIG. 6, the functional layer 400, the anti-reflection layer 500, and the cover window 20 may be further located on the light blocking control layer 600, as described above with reference to FIGS. 2A and 2B.

The display layer 200 may be located on the substrate 100. The display layer 200 may include the pixel circuit layer 210 and the display element layer 220. The pixel circuit layer 210 may include a buffer layer 211, a first gate insulating layer 213, a second gate insulating layer 215, an interlayer insulating layer 217, an organic insulating layer 219, and a pixel circuit PC. The pixel circuit PC may include a thin-film transistor TFT and a storage capacitor Cst. The thin-film transistor TFT may include a semiconductor layer Act, a gate electrode GE, a source electrode SE, and a drain electrode DE.

The buffer layer 211 may be located on the substrate 100. The buffer layer 211 may include an inorganic insulating material such as silicon nitride ($SiN_x$), silicon oxynitride (SiON), or silicon oxide ($SiO_2$), and may have a single or multi-layer structure including the inorganic insulating material.

The thin-film transistor TFT may include the semiconductor layer Act, and the semiconductor layer Act may be located on the buffer layer 211. The semiconductor layer Act may include poly silicon. Alternatively, the semiconductor layer Act may include amorphous silicon, an oxide semiconductor, or an organic semiconductor. The semiconductor layer Act may include a channel region, and a drain region and a source region located on both sides of the channel region.

The gate electrode GE may overlap the channel region. The gate electrode GE may include a low-resistance metal material. The gate electrode GE may include a conductive material including molybdenum (Mo), aluminum (Al), copper (Cu), or titanium (Ti), and may have a single or multi-layer structure including the above material.

The first gate insulating layer 213 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The second gate insulating layer 215 may be provided to cover the first gate electrode GE. The second gate insulating layer 215 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO), like the first gate insulating layer 213.

An upper electrode CE2 of the storage capacitor Cst may be located on the second gate insulating layer 215. The upper electrode CE2 may overlap the gate electrode GE that is located below the upper electrode CE2. In this case, the gate electrode GE and the upper electrode CE2 overlapping each other with the second gate insulating layer 215 therebetween may constitute the storage capacitor Cst. That is, the gate electrode GE may function as a lower electrode CE1 of the storage capacitor Cst.

In an embodiment, the storage capacitor Cst and the thin-film transistor TFT may overlap each other. In some embodiments, the storage capacitor Cst may not overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), or copper (Cu), and may have a single or multi-layer structure including the above material.

The interlayer insulating layer 217 may cover the upper electrode CE2. The interlayer insulating layer 217 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$) (e.g., ZnO or $ZnO_2$). The interlayer insulating layer 217 may have a single or multi-layer structure including the above inorganic insulating material.

Each of the drain electrode DE and the source electrode SE may be located on the interlayer insulating layer 217. Each of the drain electrode DE and the source electrode SE may be electrically connected to the semiconductor layer Act. Each of the drain electrode DE and the source electrode SE may include a material having high conductivity. Each of the drain electrode DE and the source electrode SE may include a conductive material including molybdenum (Mo), aluminum (Al), copper (Cu), or titanium (Ti), and may have a single or multi-layer structure including the above material. In an embodiment, each of the drain electrode DE and the source electrode SE may have a multi-layer structure including Ti/Al/Ti.

The organic insulating layer 219 may be located to cover the drain electrode DE and the source electrode SE. The organic insulating layer 219 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. In some embodiments, the organic insulating layer 219 may include a first organic insulating layer and a second organic insulating layer.

The display element layer 220 may be located on the pixel circuit layer 210. The display element layer 220 may be located on the organic insulating layer 219. The display element layer 220 may include a plurality of light-emitting diodes ED as a plurality of display elements. In an embodiment, the display element layer 220 may include the first light-emitting diode ED1 as a first display element, the second organic light-emitting diode (not shown) as a second display element, the third light-emitting diode ED3 as a third display element, and the pixel-defining film 225. Although the second light-emitting diode ED2 is not shown for convenience of explanation in FIG. 6, a stacked structure of the second light-emitting diode ED2 is the same as that of the first light-emitting diode ED1 and the third light-emitting diode ED3.

The first light-emitting diode ED1 and the third light-emitting diode ED3 may be located on the organic insulating layer 219. In an embodiment, the first light-emitting diode ED1 may implement the first sub-pixel P1. The second light-emitting diode ED2 may implement the second sub-pixel P2. The third light-emitting diode ED3 may implement the third sub-pixel P3.

The first light-emitting diode ED1, the second light-emitting diode ED2, and the third light-emitting diode ED3 may emit red light, green light, or blue light, or may emit red light, green light, blue light, or white light. The following will be described assuming that the first light-emitting diode ED1 emits blue light, the second light-emitting diode ED2 emits green light, and the third light-emitting diode ED3 emits red light. Also, because the second light-emitting diode ED2 and the third light-emitting diode ED3 are similar to the first light-emitting diode ED1, the following will focus on the first light-emitting diode ED1.

The first light-emitting diode ED1 may include a pixel electrode 221, an intermediate layer 222, and a common electrode 223. The pixel electrode 221 may be electrically connected to the thin-film transistor TFT through a contact hole of the organic insulating layer 219. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 221 may further include a film formed of ITO, IZO, ZnO, or $In_2O_3$ over/under the reflective film. For example, the pixel electrode 221 may have a multi-layer structure including ITO/Ag/ITO.

The pixel-defining film 225 may cover an edge of the pixel electrode 221. In an embodiment, the pixel-defining film 225 may include an organic insulating material or an inorganic material. In an embodiment, the pixel-defining film 225 may be transparent. In an embodiment, the pixel-defining film 225 may include a black matrix. In this case, the pixel-defining film 225 may be opaque.

The pixel-defining film 225 may have the openings OP1, OP2, and OP3, as shown in FIGS. 5 and 6. The openings OP1, OP2, and OP3 may expose a central portion of the pixel electrode 221. Each of the openings OP1, OP2, and OP3 may define an emission area of light emitted by the light-emitting diode ED. In an embodiment, a width of the first emission layer EA1 in the first direction (e.g., the x direction) may be greater than a width of the first emission area EA1 in the second direction (e.g., the y direction).

The intermediate layer 222 may include a first functional layer 222*a*, an emission layer 222*b*, and a second functional layer 222*c*. The emission layer 222*b* may include a high molecular weight organic material or a low molecular weight organic material emitting light of a certain color.

In an embodiment, at least one of the first functional layer 222*a* and the second functional layer 222*c* may be a common layer entirely located over the display area. The first functional layer 222*a* may include, for example, a hole transport layer (HTL), or may include a hole transport layer and a hole injection layer (HIL). The second functional layer 222*c* may include an electron transport layer (ETL) or an electron injection layer (EIL). In some embodiments, the second functional layer 222*c* may be omitted.

The common layer 223 may be located on the emission layer 222*b*. The common electrode 223 may be formed of a conductive material having a low work function. For example, the common electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the common electrode 223 may further include a layer formed of ITO, IZO, ZnO, or $In_2O_3$ on the (semi)transparent layer including the above material.

In some embodiments, a capping layer (not shown) may be further located on the common electrode 223. The capping layer may include LiF, an inorganic material, or an organic material.

Figure 8A:
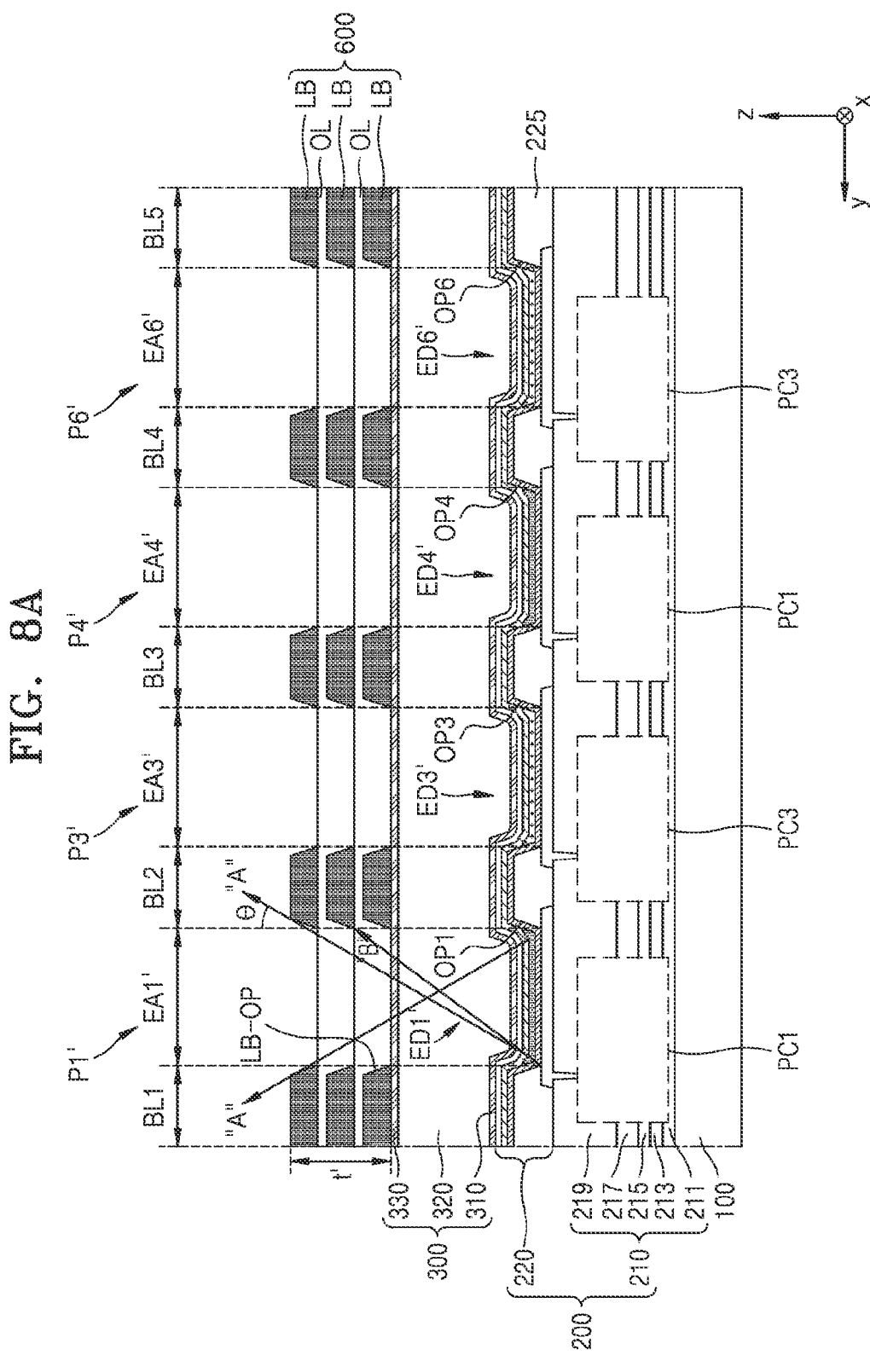
FIG. 8A is a cross-sectional view taken along line C-C' of the display panel of FIG. 7A.

The encapsulation layer 300 may cover the display element layer 220. The encapsulation layer 300 may cover the first light-emitting diode ED1, the second light-emitting diode ED2, and the third light-emitting diode ED3. In an embodiment, the encapsulation layer 300 may include at least one inorganic encapsulation layer and at least one organic encapsulation layer. In FIGS. 6 and 8A, the encapsulation layer 300 includes a first inorganic encapsulation layer 310, an organic encapsulation layer 320, and a second inorganic encapsulation layer 330 which are sequentially stacked.

The at least one inorganic encapsulation layer may include at least one inorganic material from among aluminum oxide ($Al_2O_3$), titanium oxide ($TiO_2$), tantalum oxide ($Ta_2O_5$), hafnium oxide ($HfO_2$), zinc oxide ($ZnO_x$) (e.g., ZnO or $ZnO_2$), silicon oxide ($SiO_2$), silicon nitride ($SiN_x$), and silicon oxynitride (SiON). In an embodiment, the first inorganic encapsulation layer 310 may include silicon oxynitride (SiON). The second inorganic encapsulation layer 330 may include silicon nitride ($SiN_x$).

The at least one organic encapsulation layer may include a polymer-based material. Examples of the polymer-based material may include an acrylic resin, an epoxy resin, polyimide, and polyethylene. In an embodiment, the at least one organic encapsulation layer may include acrylate.

The light blocking control layer 600 may be located on the encapsulation layer 300. The light blocking control layer 600 may include a plurality of light blocking pattern layers LB and a plurality of insulating layers OL. The plurality of light blocking pattern layers LB and the plurality of insulating layers OL may be alternately stacked. Because there is a limitation in increasing a thickness of one light blocking pattern layer LB to a certain thickness or more during a manufacturing process, a thickness of the light blocking control layer 600 may be easily controlled by alternately stacking the plurality of light blocking pattern layers LB and the plurality of insulating layers OL to form the light blocking control layer 600.

In an embodiment, each of the plurality of light blocking pattern layers LB may include a black matrix. The plurality of light blocking pattern layers LB may include a light blocking material, and may be black. The light blocking material may include a resin or paste including carbon black, carbon nanotubes, or a black dye, metal particles such as nickel, aluminum, molybdenum, or an alloy thereof, metal oxide particles (e.g., chromium oxide), or metal nitride particles (e.g., chromium nitride).

The plurality of light blocking pattern layers LB may respectively have openings LB-OP corresponding to the first through third emission areas EA1, EA2, and EA3. Light emitted by the first through third light-emitting diodes ED1, ED2, and ED3 may be emitted to the outside through the openings LB-OP.

In a plan view, the plurality of light blocking pattern layers LB may form the first light blocking line BL1, the second light blocking line BL2, and the third light blocking line BL3 as shown in FIG. 5. That is, the first light blocking line BL1, the second light blocking line BL2, and the third light blocking line BL3 may respectively correspond to portions of the plurality of light blocking pattern layers LB of the substrate 100 in an x-y plane. In more detail, referring to FIGS. 5 and 6, a portion located on a side of the first and second emission areas EA1 and EA2 from among the plurality of light blocking pattern layers LB may correspond to the first light blocking line BL1, a portion located between the first and second emission areas EA1 and EA2 and the third emission area EA3 from among the plurality of light blocking pattern layers LB may correspond to the second light blocking line BL2, and a portion located on the other side of the third emission area EA3 from among the plurality of light blocking pattern layers LB may correspond to the third light blocking line BL3.

The plurality of insulating layers OL may include a light-transmitting organic material. For example, the plurality of insulating layers OL may include a polymer material or a monomer material. For example, the plurality of insulating layers OL may include an acrylic resin, an epoxy resin, polyimide, or polyethylene, or may include polydiarylsiloxane, methyltrimethoxysilane, or tetramethoxysilane. In an embodiment, the plurality of insulating layers OL may be formed by performing an inkjet printing process and then curing. In another embodiment, the plurality of insulating layers OL may be formed by using an evaporation process.

In an embodiment, the plurality of insulating layers OL may directly contact each other corresponding to the openings LB-OP of the plurality of light blocking pattern layers LB. Two adjacent insulating layers OL from among the plurality of insulating layers OL may be located with one light blocking pattern layer LB therebetween, but may directly contact each other through the opening LB-OP of the light blocking pattern layer LB.

In an embodiment, although the light blocking pattern layer LB that is at a lowermost location from among the plurality of light blocking pattern layers LB is located directly on the second inorganic encapsulation layer 330 in FIG. 6, the disclosure is not limited thereto. In another embodiment, a filling layer may be further located between the encapsulation layer 300 and the light blocking pattern layer LB that is at a lowermost location from among the plurality of light blocking pattern layers LB.

In an embodiment, a vertical distance vd from a top surface of the emission layer 222*b* to the light blocking pattern layer LB that is at an uppermost location from among the plurality of light blocking pattern layers LB may be equal to or greater than about 50 μm. Preferably, the vertical distance vd may range from about 50 μm to about 200 μm, and more preferably, may range from about 80 μm to about 120 μm. The vertical distance vd may be a distance from the top surface of the emission layer 222*b* to a bottom surface of the light blocking pattern layer LB that is at an uppermost location from among the plurality of light blocking pattern layers LB.

As such, only when the vertical distance vd from the top surface of the emission layer 222*b* to the light blocking pattern layer LB that is at an uppermost location from among the plurality of light blocking pattern layers LB is equal to or greater than a certain distance, a viewing angle of light emitted by the emission layer 222*b* may be easily controlled.

Light emitted by the emission layer 222*b* may travel in the +z direction. Some light may obliquely travel in the +z direction. Light traveling in a direction "A" may be emitted to the outside, and light traveling in a direction "B" may not be emitted to the outside due to the plurality of light blocking pattern layers LB. In an embodiment, a viewing angle Θ of the light traveling in the direction "A" may be equal to or less than 30°, and a viewing angle of the light traveling in the direction "B" may exceed 30°.

Figure 11:
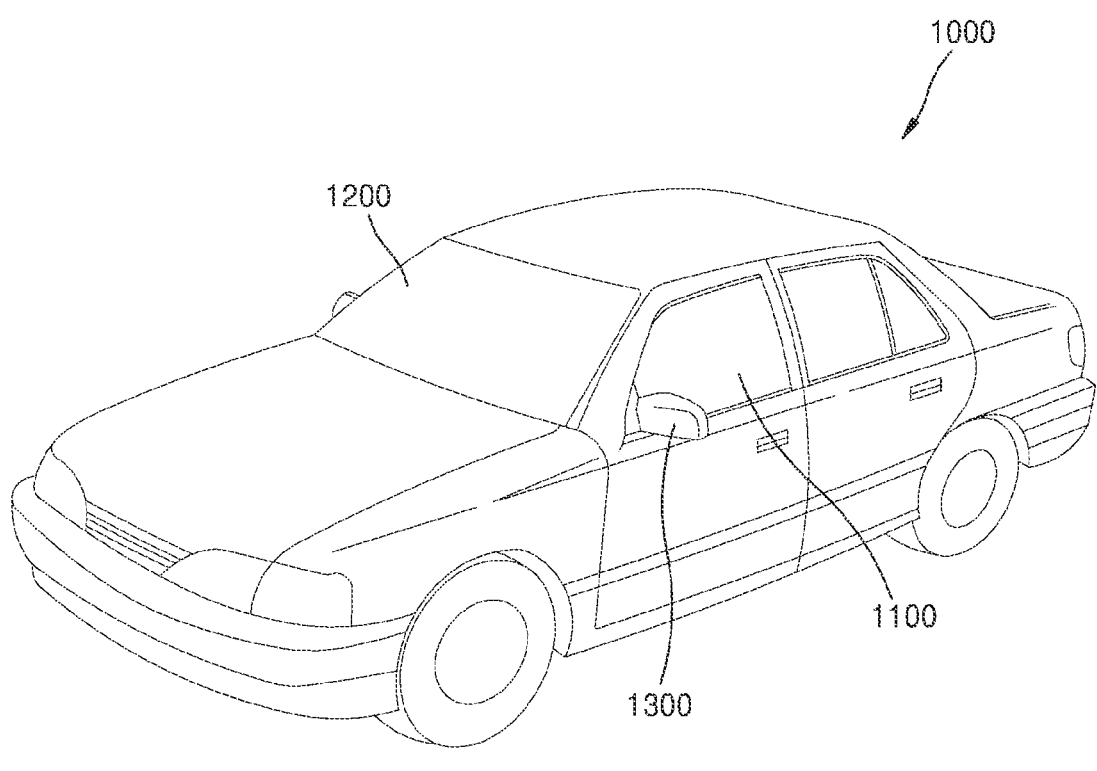
FIG. 11 is a view illustrating an appearance of a vehicle, according to an embodiment.
Figure 12A:
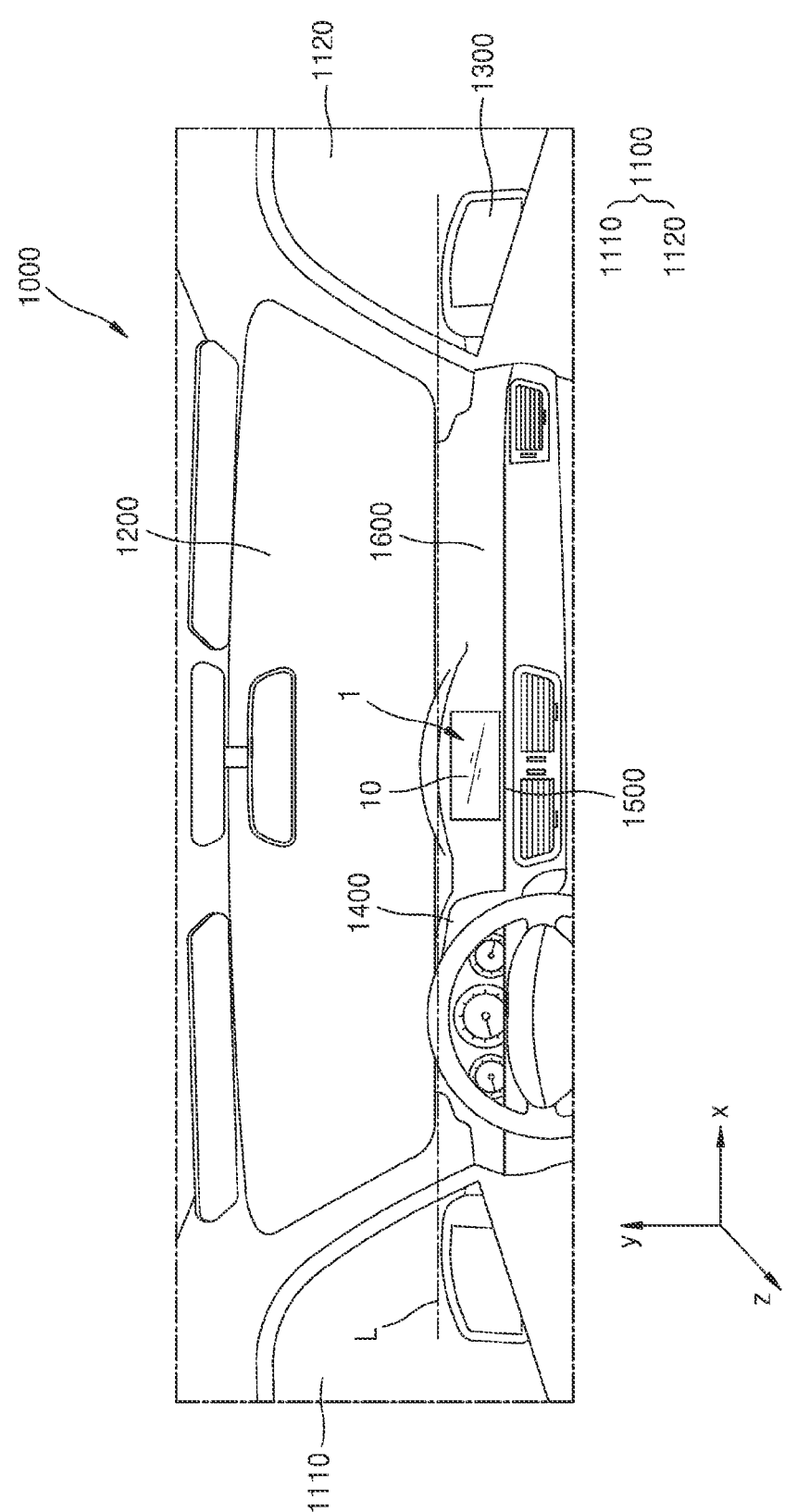
FIGS. 12A, 12B, and 12C are views illustrating the inside of the vehicle, according to various embodiments.
Figure 12B:
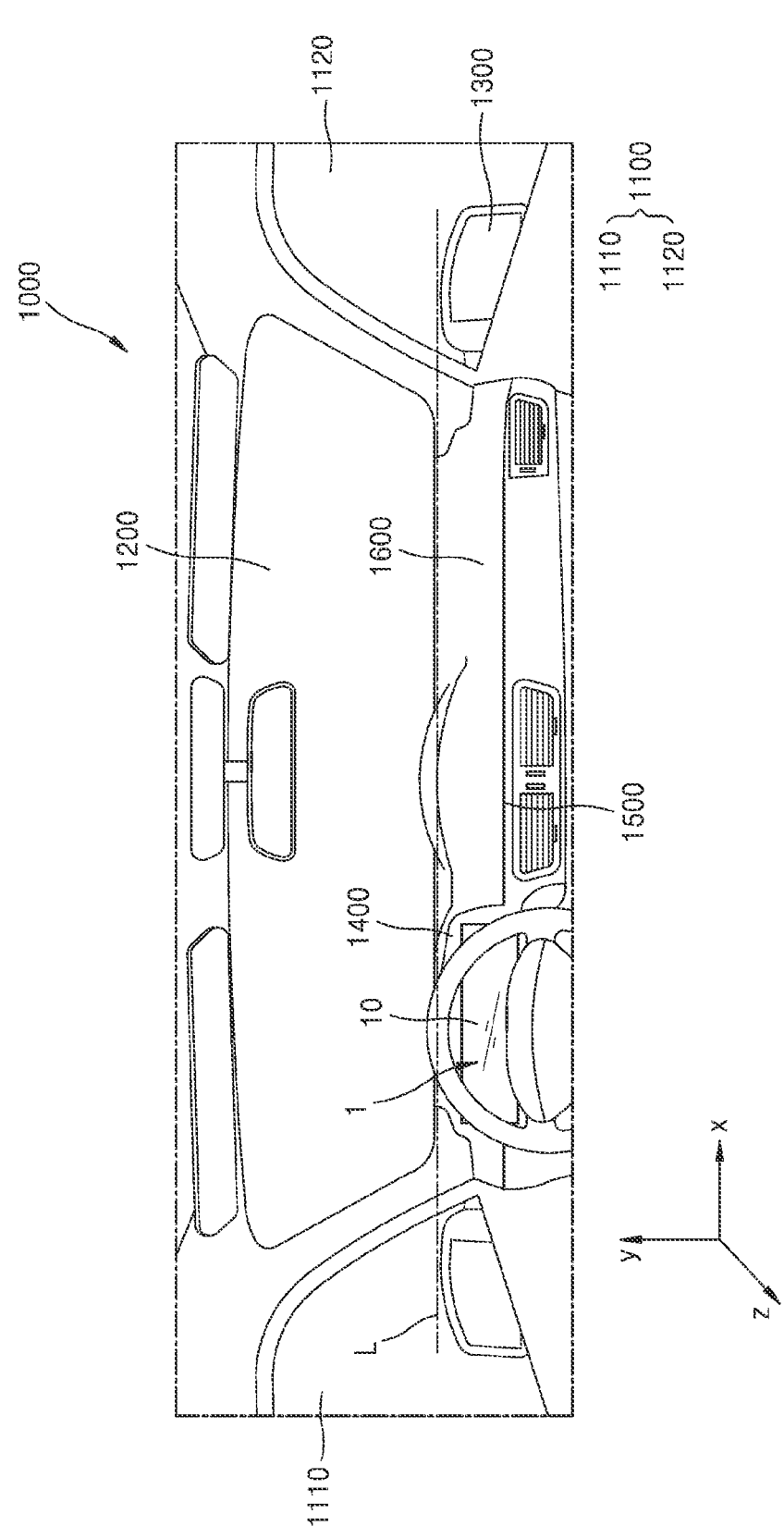
Figure 12C:
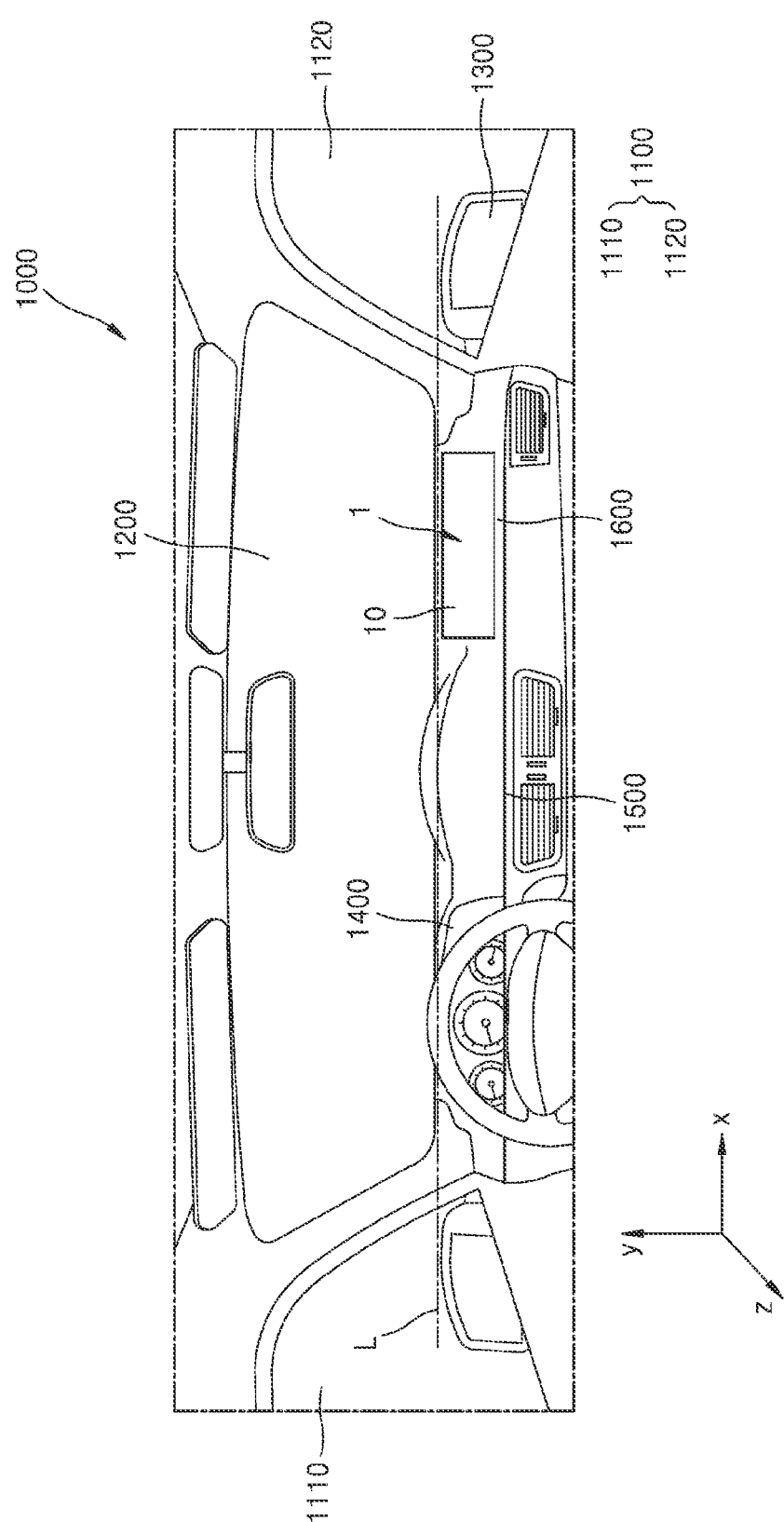

For example, the display panel 10 according to an embodiment may be mounted on a means of transportation such as a vehicle as shown in FIGS. 11 through 12C described below. A driver in the vehicle may be a user of the display panel 10. When a viewing angle of the display panel 10 exceeds 30° from the user's viewpoint, light emitted by the display panel 10 may be reflected by a front window glass or the like and may obstruct the user's vision during driving. Accordingly, in the display panel 10 according to an embodiment, the viewing angle Θ of light emitted by the display panel 10 may be controlled to be equal to or less than 30°, so that obstruction of the user's vision during driving due to reflection of light emitted by the display panel 10 may be removed or minimized.

Figure 7A:
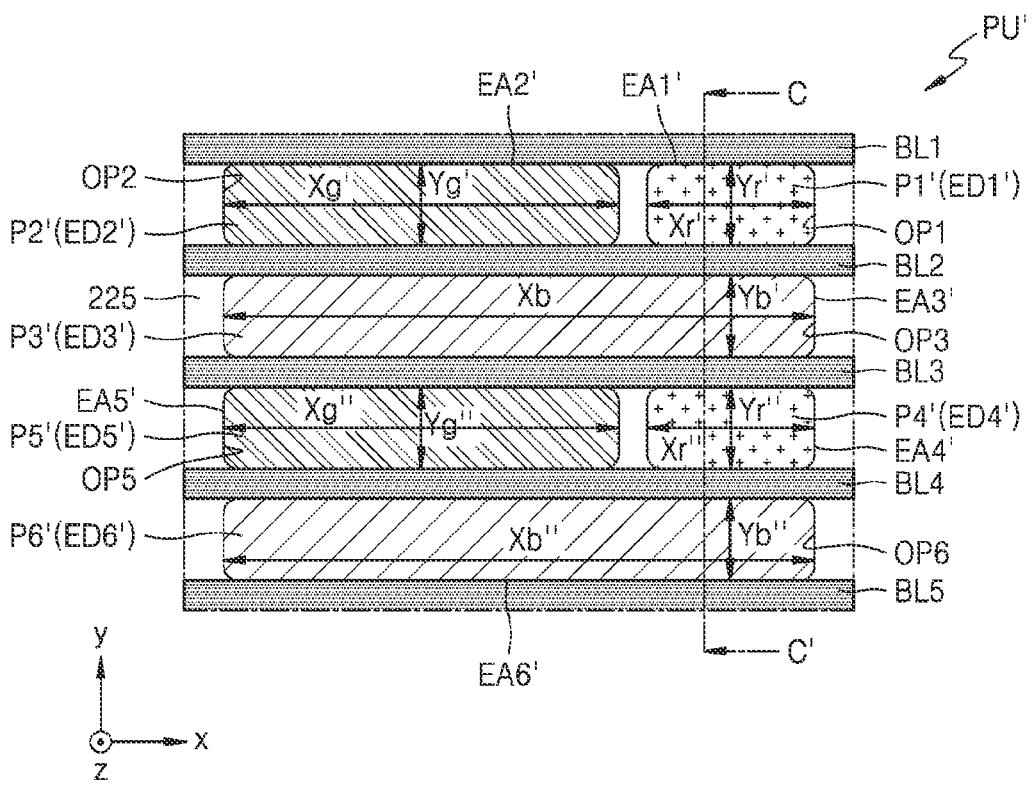
FIGS. 7A and 7B are enlarged plan views illustrating a portion of a display panel, according to an embodiment.
Figure 7B:
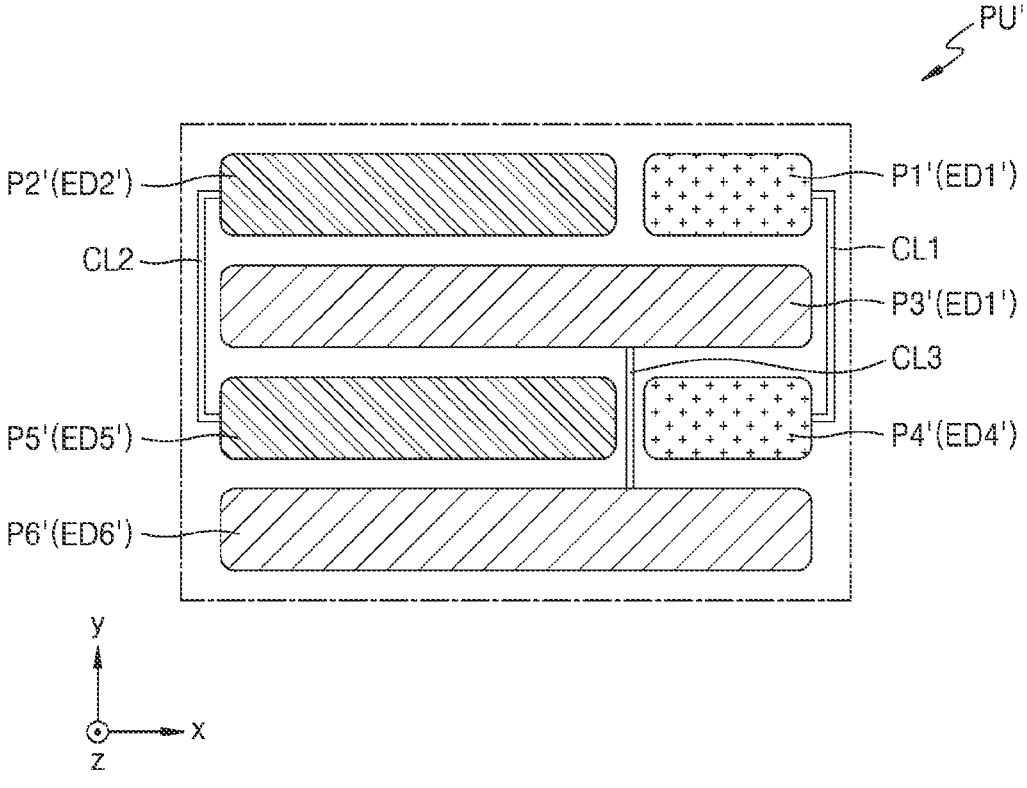
Figure 8B:
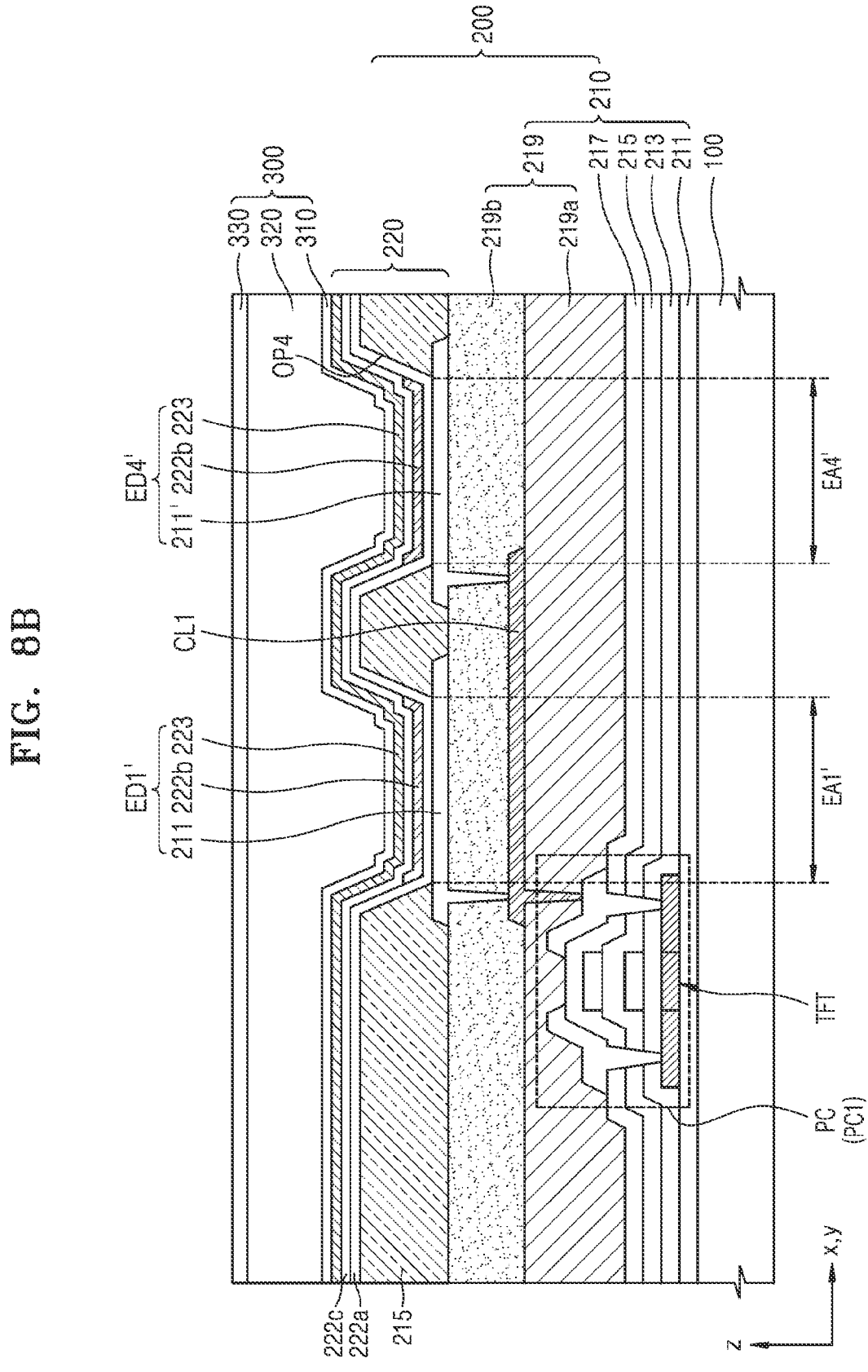
FIGS. 8B and 8C are cross-sectional views illustrating two adjacent pixels of FIG. 7B, which emit light of the same color.
Figure 8C:
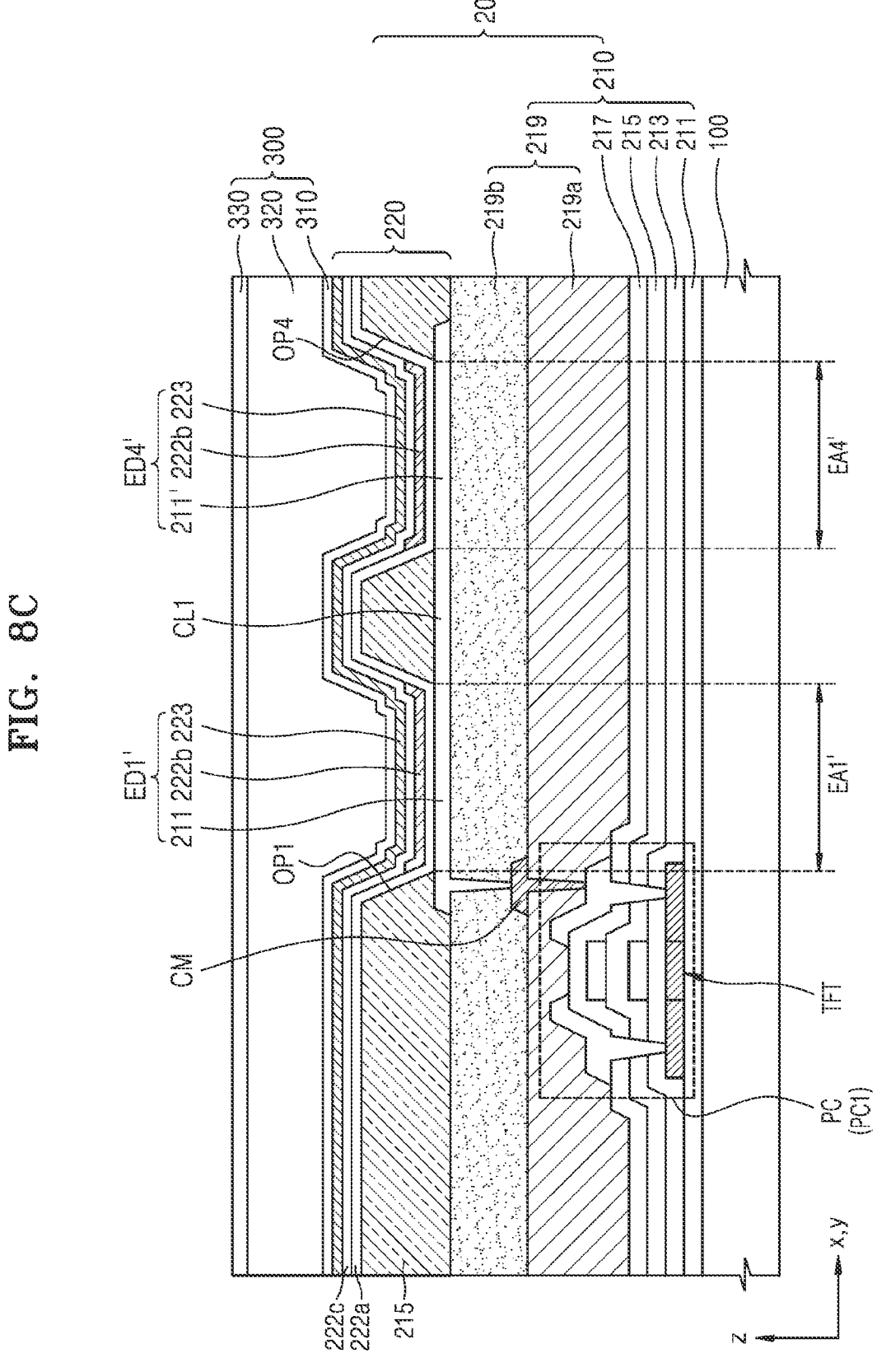

FIGS. 7A and 7B are enlarged plan views illustrating a portion of a display panel, according to an embodiment. FIG. 8A is a cross-sectional view taken along line C-C' of the display panel of FIG. 7A. FIGS. 8B and 8C are cross-sectional views illustrating a connection structure of two adjacent pixels of FIG. 7B, which emit light of the same color.

Referring to FIGS. 7A and 8A, the display panel 10 includes the first light blocking line BL1, the second light blocking line BL2, the third light blocking line BL3, a fourth light blocking line BL4, and a fifth light blocking line BL5 which extend in one direction, and a first sub-pixel P1' including a first display element, a second sub-pixel P2' including a second display element, a third sub-pixel P3' including a third display element, a fourth sub-pixel P4' including a fourth display element, a fifth sub-pixel P5' including a fifth display element, and a sixth sub-pixel P6' including a sixth display element which are located between the first through fifth light blocking lines BL1, BL2, BL3, BL4, and BL5. For example, the first display element may be a first light-emitting diode ED1', the second display element may be a second light-emitting diode ED2', the third display element may be a third light-emitting diode ED3', the fourth display element may be a fourth light-emitting diode ED4', the fifth display element may be a fifth light-emitting diode ED5', and the sixth display element may be a sixth light-emitting diode ED6'.

In an embodiment, the first sub-pixel P1', the second sub-pixel P2', and the third sub-pixel P3' may emit light having different wavelengths, and the fourth sub-pixel P4', the fifth sub-pixel P5', and the sixth sub-pixel P6' may emit light having different wavelengths, to constitute one pixel unit PU'. In an embodiment, the first sub-pixel P1' and the fourth sub-pixel P4' may emit first color light having the same wavelength, the second sub-pixel P2' and the fifth sub-pixel P5' may emit second color light having the same wavelength, and the third sub-pixel P3' and the sixth sub-pixel P6' may emit third color light having the same wavelength. For example, the first color light may be red light, the second color light may be green light, and the third color light may be blue light.

In FIGS. 7A and 8A, a basic structure is similar to that described with reference to FIGS. 5 and 6, and thus the following will focus on a difference and a repeated description will be omitted.

Referring to FIGS. 7A and 8A, each of the first light blocking line BL1 through the fifth light blocking line BL5 may extend in the first direction (e.g., the x direction). The first light blocking line BL1 through the fifth light blocking line BL5 may be spaced apart from one another in the second direction (e.g., the y direction) that intersects the first direction (e.g., the x direction). The first sub-pixel P1' through the sixth sub-pixel P6' may be located between the first light blocking line BL1 through the fifth light blocking line BL5 that are spaced apart from one another. Although one pixel unit PU' is illustrated in FIG. 7A, the first light blocking line BL1 through the fifth light blocking line BL5 may continuously extend in the first direction (e.g., the x direction). Lengths of the first light blocking line BL1 through the fifth light blocking line BL5 may correspond to the horizontal width Ix of the display area DA of FIG. 4.

In an embodiment, the first sub-pixel P1' and the second sub-pixel P2' may be located between the first light blocking line BL1 and the second light blocking line BL2, the third sub-pixel P3' may be located between the second light blocking line BL2 and the third light blocking line BL3, the fourth sub-pixel P4' and the fifth sub-pixel P5' may be located between the third light blocking line BL3 and the fourth light blocking line BL4, and the sixth sub-pixel P6' may be located between the fourth light blocking line BL4 and the fifth light blocking line BL5. That is, the first sub-pixel P1' and the second sub-pixel P2' may be located in a first row R1, the third sub-pixel P3' may be located in a second row R2, the fourth sub-pixel P4' and the fifth sub-pixel P5' may be located in a third row R3, and the sixth sub-pixel P6' may be located in a fourth row R4.

The first sub-pixel P1' through the sixth sub-pixel P6' may respectively have first widths Xr', Xg', Xb', Xr", Xg", and Xb" extending in the first direction (e.g., the x direction) and second widths Yr', Yg', Yb', Yr", Yg", and Yb" extending in the second direction (e.g., the y direction). The first widths Xr', Xg', Xb', Xr", Xg", and Xb" and the second widths Yr', Yg', Yb', Yr", Yg", and Yb" of the first sub-pixel P1' through the sixth sub-pixel P6' may refer to the first widths Xr', Xg', Xb', Xr", Xg", and Xb" and the second widths Yr', Yg', Yb', Yr", Yg", and Yb" of emission areas EA1', EA2', EA3', EA4', EA5', and EA6' of the first sub-pixel P1' through the sixth sub-pixel P6'. In an embodiment, in the first sub-pixel P1' through the sixth sub-pixel P6', the first widths Xr', Xg', Xb', Xr", Xg", and Xb" may be greater than the second widths Yr', Yg', Yb', Yr", Yg", and Yb". When viewed from a user's viewpoint, the first widths Xr', Xg', Xb', Xr", Xg", and Xb" may correspond to a horizontal direction, and the second widths Yr', Yg', Yb', Yr", Yg", and Yb" may correspond to a vertical direction. That is, the width of each of the first sub-pixel P1' through the sixth sub-pixel P6' in the horizontal direction may be greater than that in the vertical direction. The horizontal direction and the vertical direction of the first sub-pixel P1' through the sixth sub-pixel P6' should be considered in association with the user's viewpoint and perception direction, because they are related to a viewing angle described below.

The number of sub-pixels of the pixel unit PU' of FIG. 7 may be twice the number of sub-pixels of the pixel unit PU of FIG. 5 on almost the same area. That is, for example, the pixel unit PU of FIG. 5 may include three sub-pixels P1, P2, and P3 whereas the pixel unit PU' of FIG. 7A may include six sub-pixels P1', P2', P3', P4', P5', and P6'. Although the number of sub-pixels in FIG. 7A is twice the number of sub-pixels of the pixel unit PU of FIG. 5, in another embodiment, the number of sub-pixels in FIG. 7A may be n times (n is a natural number) the number of sub-pixels of the pixel unit PU of FIG. 5.

Because the area of the pixel unit PU of FIG. 5 and the area of the pixel unit PU' of FIG. 7A are substantially the same, an emission size of each of the first through sixth sub-pixels P1', P2', P3', P4', P5', and P6' of the pixel unit PU' of FIG. 7A may be less than an emission size of each of the first through third sub-pixels P1, P2, and P3 of the pixel unit PU of FIG. 5. However, because the areas of the pixel unit PU of FIG. 5 and the pixel unit PU' of FIG. 7A are substantially the same, a sum of the emission sizes of the first through sixth sub-pixels P1', P2', P3', P4', P5', and P6' of the pixel unit PU' of FIG. 7A may be substantially the same as a sum of the emission sizes of the first through third sub-pixels P1, P2, and P3 of the pixel unit PU of FIG. 5. The emission size may be defined as an emission area. The first emission area EA1' may be defined through a first opening OP1 of the pixel-defining film 225, the second emission area EA2' may be defined through a second opening OP2 of the pixel-defining film 225, the third emission area EA3' may be defined through a third opening OP3 of the pixel-defining film 225, the fourth emission area EA4' may be defined through a fourth opening OP4 of the pixel-defining film 225, the fifth emission area EA5' may be defined through a fifth opening OP5 of the pixel-defining film 225, and the sixth emission area EA6' may be defined through a sixth opening OP6 of the pixel-defining film 225.

In more detail, a sum of the first emission area EA1' of the first sub-pixel P1' and the fourth emission area EA4' of the fourth sub-pixel P4' of FIG. 7A may be substantially the same as a sum of the first emission area EA1 of the first sub-pixel P1 of FIG. 5. Also, a sum of the second emission area EA2' of the second sub-pixel P2' and the fifth emission area EA5' of the fifth sub-pixel P5' of FIG. 7A may be substantially the same as a sum of the second emission area EA2 of the second sub-pixel P2 of FIG. 5. Also, a sum of the third emission area EA3' of the third sub-pixel P3' and the sixth emission area EA6' of the sixth sub-pixel P6' of FIG. 7A may be substantially the same as a sum of the third emission area EA3 of the third sub-pixel P3 of FIG. 5.

In an embodiment, the first sub-pixel P1' and the fourth sub-pixel P4' may interoperate with each other, the second sub-pixel P2' and the fifth sub-pixel P5' may interoperate with each other, and the third sub-pixel P3' and the sixth sub-pixel P6' may interoperate with each other. When a plurality of sub-pixels interoperate with one another, it may mean that the plurality of sub-pixels share the same pixel circuit. For example, the first sub-pixel P1' and the fourth sub-pixel P4' may be electrically connected to each other through a first connection wiring CL1, the second sub-pixel P2' and the fifth sub-pixel P5' may be electrically connected to each other through a second connection wiring CL2, and the third sub-pixel P3' and the sixth sub-pixel P6' may be electrically connected to each other through a third connection wiring CL3. A connection structure of the first through third connection wirings CL1, CL2, and CL3 of FIG. 7B is merely an example, and a method by which the first through third connection wirings CL1, CL2, and CL3 are connected to the first through sixth sub-pixels P1', P2', P3', P4', P5', and P6' may be changed in various ways.

Referring to FIG. 8A, for example, the first sub-pixel P1' and the fourth sub-pixel P4' which emit light of the same color may share a first pixel circuit PC1. Also, the third sub-pixel P3' and the sixth sub-pixel P6' which emit light of the same color may share a third pixel circuit PC3. Although not shown in FIG. 8A, the second sub-pixel P2' and the fifth sub-pixel P5' which emit light of the same color may share a second pixel circuit. Accordingly, the first sub-pixel P1' and the fourth sub-pixel P4' may simultaneously emit light at the same level, the second sub-pixel P2' and the fifth sub-pixel P5' may simultaneously emit light at the same level, and the third sub-pixel P3' and the sixth sub-pixel P6' may simultaneously emit light at the same level. Because a pixel circuit does not need to be formed for each sub-pixel through this structure, a process may be simplified, and a sufficient space in forming the pixel circuit may be secured. Also, because the area of each sub-pixel is reduced but sub-pixels emitting light of the same color simultaneously emit light, the same level of aperture ratio and resolution may be maintained when compared to the embodiment of FIG. 5.

Although the first pixel circuit PC1 shared by the first sub-pixel P1' and the fourth sub-pixel P4' is located under the first sub-pixel P1' and under the fourth sub-pixel P4' for convenience of explanation in FIG. 8, the pixel circuit PC1 located under the first sub-pixel P1' and under the fourth sub-pixel P4' may be substantially the same pixel circuit.

In more detail, a structure in which the first sub-pixel P1' and the fourth sub-pixel P4' are connected to each other will be described with reference to FIGS. 8B and 8C. Although the first sub-pixel P1' and the fourth sub-pixel P4' are illustrated in FIGS. 8B and 8C, this structure may also be applied to the second sub-pixel P2' and the fifth sub-pixel P5', and the third sub-pixel P3' and the sixth sub-pixel P6'.

In an embodiment, as shown in FIG. 8B, the organic insulating layer 219 may include a first organic insulating layer 219a on the thin-film transistor TFT and a second organic insulating layer 219b on the first organic insulating layer 219a. The first connection wiring CL1 may be located on the first organic insulating layer 219a. Through the first connection wiring CL1, the first light-emitting diode EDF of the first sub-pixel P1' and the fourth light-emitting diode ED4' of the fourth sub-pixel P4' may be electrically connected to the first pixel circuit PC1.

In an embodiment, as shown in FIG. 8C, the first light-emitting diode EDF may be connected to the first pixel circuit PC1 through a contact metal CM located between the first organic insulating layer 219a and the second organic insulating layer 219b, and a pixel electrode 211' of the fourth light-emitting diode ED4' may be connected to a pixel electrode 211 of the first light-emitting diode ED1'. The first connection wiring CL1 may be located on the same layer as the pixel electrode 211 of the first light-emitting diode EDF and the pixel electrode 211' of the fourth light-emitting diode ED4', and may directly connect the pixel electrode 211 of the first light-emitting diode EDF to the pixel electrode 211' of the fourth light-emitting diode ED4' on the organic insulating layer 219. In this case, the first connection wiring CL1 may include the same material as that of the pixel electrode 211.

In an embodiment, the second width Yr' of the first sub-pixel P1', the second width Yg' of the second sub-pixel P2', the second width Yb' of the third sub-pixel P3', the second width Yr" of the fourth sub-pixel P4', the second width Yg" of the fifth sub-pixel P5', and the second width Yb" of the sixth sub-pixel P6' may be the same. As such, only when the second widths Yr', Yg', Yb', Yr", Yg", and Yb" of the first through sixth sub-pixels P1', P2', P3', P4', P5', and P6' are the same, the first through sixth sub-pixels P1', P2', P3', P4', P5', and P6' may have the same viewing angle and the same luminance reduction rate, thereby maintaining or improving uniform WAD quality.

In an embodiment, a vertical width (second width) of sub-pixels may be proportional to a thickness of the light blocking control layer 600. In detail, when compared to the embodiment of FIGS. 5 and 6 with the embodiment of FIGS. 7A and 8A, each of the second widths Yr', Yg', Yb', Yr", Yg", and Yb" of the first through sixth sub-pixels P1', P2', P3', P4', P5', and P6' may be about ½ of each of the second widths Yr, Yg, and Yb of the first through third sub-pixels P1, P2, and P3 of FIG. 5. In this case, a thickness t' of the light blocking layer 600 of FIG. 8A may be about ½ of the thickness t of the light blocking control layer 600 of FIG. 6.

As such, as shown in FIG. 7A, because sub-pixels that are n times sub-pixels (n is a natural number) are located on the same area, the second widths Yr', Yg', Yb', Yr", Yg", and Yb" of the first through sixth sub-pixels P1', P2', P3', P4', P5', and P6' may be reduced. Accordingly, the thickness t' of the light blocking control layer 600 may be reduced based on the same viewing angle, thereby simplifying a process.

Figure 9A:
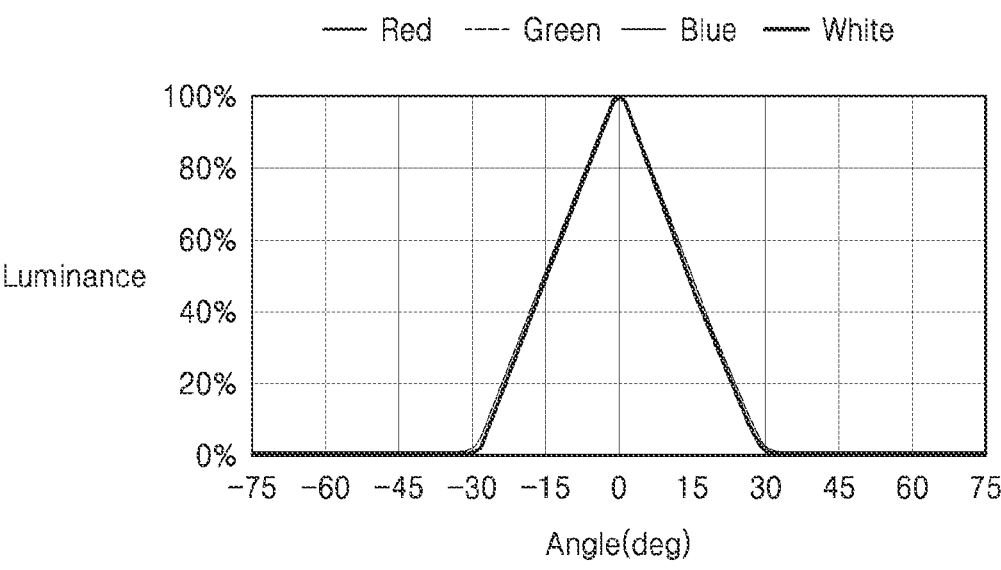
FIG. 9A is a graph showing a white angle difference (WAD) according to a viewing angle of a display panel, according to an embodiment.
Figure 9B:
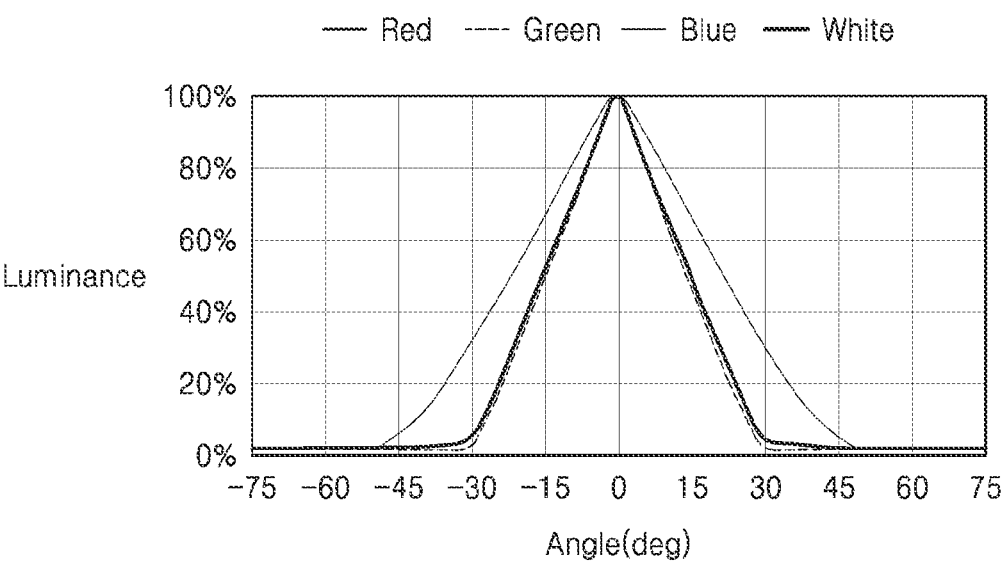
FIG. 9B is a graph showing a WAD according to a viewing angle of a display panel, according to a comparative example.

FIG. 9A is a graph showing a WAD according to a viewing angle of a display panel according to an embodiment. FIG. 9B is a graph showing a WAD according to a viewing angle of a display panel according to a comparative example.

Referring to FIGS. 9A and 9B, graphs show a luminance deviation with respect to a viewing angle of each of a red sub-pixel, a green sub-pixel, and a blue sub-pixel.

FIG. 9A is a graph for the display panel 10 according to an embodiment, and a red sub-pixel, a green sub-pixel, and a blue sub-pixel may respectively correspond to, for example, the first sub-pixel P1, the second sub-pixel P2, and the third sub-pixel P3 of FIG. 5. In the display panel 10 according to an embodiment, as described with reference to FIGS. 5 through 8A, the second width Yr of the first sub-pixel P1, the second width Yg of the second sub-pixel P2, and the second width Yb of the third sub-pixel P3 in a vertical direction may be the same. Accordingly, it is found that the red sub-pixel, the green sub-pixel, and the blue sub-pixel may have the same luminance deviation with respect to a viewing angle.

In contrast, FIG. 9B is a comparative example when a vertical width of a blue sub-pixel is greater than a vertical width of a red sub-pixel and a green sub-pixel. In this case, it is found that a luminance deviation with respect to a viewing angle of the blue sub-pixel is different from a luminance deviation with respect to a viewing angle of the red sub-pixel and the green sub-pixel. That is, when at least one of a vertical width of the first sub-pixel, a vertical width of the second sub-pixel, and a vertical width of the third sub-pixel is different, as shown in FIG. 9B, a luminance deviation with respect to a viewing angle in a specific sub-pixel is different. This may lead to WAD quality degradation and may reduce the reliability of a display panel.

Figure 10:
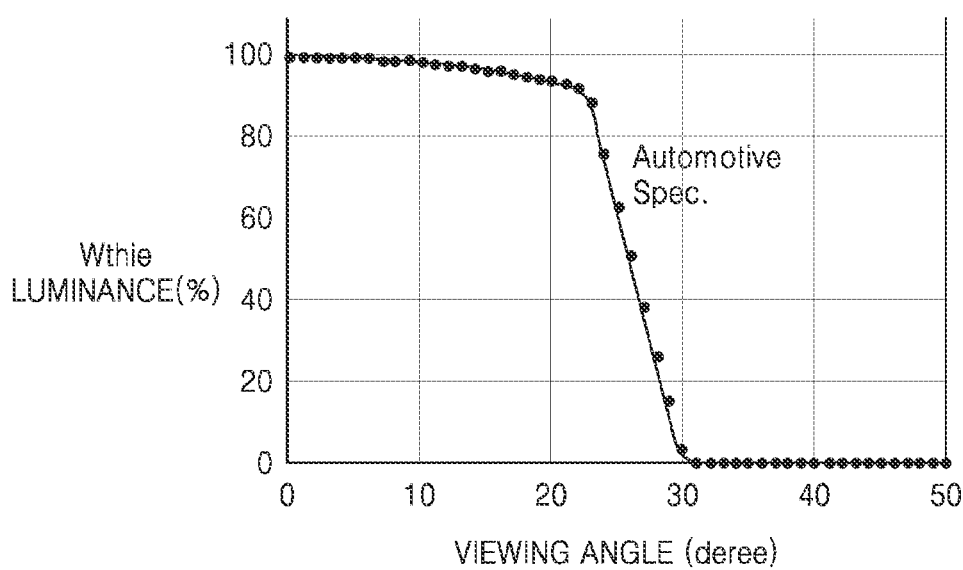
FIG. 10 is a graph showing a luminance with respect to a viewing angle in a display panel, according to an embodiment.

FIG. 10 is a graph showing a luminance with respect to a viewing angle in a display panel, according to an embodiment.

Referring to FIG. 10, it may be preferable that a viewing angle of the display panel 10 of the disclosure is equal to or less than 30°. It is found that, when a viewing angle is 30°, a luminance is greatly reduced around 30°, and when a viewing angle exceeds 30°, a luminance converges to 0.

In the display panel 10 according to an embodiment, the second width Yr of the first sub-pixel P1, the second width Yg of the second sub-pixel P2, and the second width Yb of the third sub-pixel P3 in a vertical direction may be designed to be the same, and thus all sub-pixels may be controlled to have a viewing angle of 30° or less, thereby minimizing a luminance deviation.

FIG. 11 is a view illustrating an appearance of a vehicle 1000, according to an embodiment. FIGS. 12A through 12C are views illustrating the inside of the vehicle 1000, according to various embodiments.

Referring to FIGS. 11, 12A, 12B, and 12C, the vehicle 1000 may refer to any of various devices for moving a transported object such as a human, a solid object, or an animal from a starting point to a destination. Examples of the vehicle 1000 may include a vehicle traveling on a road or a track, a vessel moving over the sea or river, and an airplane flying in the sky using the action of air.

The vehicle 1000 may travel on a road or a track. The vehicle 1000 may move in a certain direction according to the rotation of at least one wheel. Examples of the vehicle 1000 may include a three or four-wheeled vehicle, a construction machine, a two-wheeled vehicle, a moped, a bicycle, and a train running on a track.

The vehicle 1000 may include a body including an interior and an exterior, and a chassis that is a portion other than the body and on which mechanical devices required for driving are installed. The exterior of the body may include a filler provided at a boundary between a front panel, a bonnet, a roof panel, a rear panel, a trunk, and a door. The chassis of the vehicle 1000 may include a power generating device, a power transmitting device, a driving device, a steering device, a braking device, a suspension device, a transmission device, a fuel device, and front, rear, left, and right wheels.

The vehicle 1000 may include a side window glass 1100, a front window glass 1200, a side mirror 1300, a cluster 1400, a center fascia 1500, a passenger seat dashboard 1600, and a display apparatus 1.

The side window glass 1100 and the front window glass 1200 may be divided by a filler located between the side window glass 1100 and the front window glass 1200.

The side window glass 1100 may be installed on a side surface of the vehicle 1000. In an embodiment, the side window glass 1100 may be installed on a door of the vehicle 1000. A plurality of side window glasses 1100 may be provided to face one another. In an embodiment, the side window glass 1100 may include a first side window glass 1110 and a second side window glass 1120. In an embodiment, the first side window glass 1110 may be located adjacent to the cluster 1400. The second side window glass 1120 may be located adjacent to the passenger seat dashboard 1600.

In an embodiment, the side window glasses 1100 may be spaced apart from each other in the x direction or the −x direction. For example, the first side window glass 1110 and the second side window glass 1120 may be spaced apart from each other in the x direction or the –x direction. In other words, an imaginary straight line L that connects the side window glasses 1100 may extend in the x direction or the –x direction. For example, the imaginary straight line L that connects the first side window glass 1110 and the second side window glass 1120 may extend in the x direction or the –x direction.

The front window glass 1200 may be provided in a front portion of the vehicle 1000. The front window glass 1200 may be located between the side window glasses 1100 that face each other.

The side mirror 1300 may provide a rear view of the vehicle 1000. The side mirror 1300 may be provided on the exterior of the body. In an embodiment, a plurality of side mirrors 1300 may be provided. Any one of the plurality of side mirrors 1300 may be located outside the first side window glass 1110. Another one of the plurality of side mirrors 1300 may be located outside the second side window glass 1120.

The cluster 1400 may be located in front of a steering wheel. The cluster 1400 may include a tachometer, a speedometer, a coolant thermometer, a fuel gauge, a turn signal indicator, a high beam warning light, a warning light, a seat belt warning light, an odometer, an odograph, an automatic transmission selection lever indicator, a door open warning light, an engine oil warning light, or a low fuel warning light.

The center fascia 1500 may include a control panel on which a plurality of buttons for adjusting an audio device, an air conditioning device, and a heater of a seat are located. The center fascia 1500 may be located on a side of the cluster 1400.

The passenger seat dashboard 1600 may be spaced apart from the cluster 1400 with the center fascia 1500 therebetween. In an embodiment, the cluster 1400 may be located to correspond to a driver seat (not shown), and the passenger seat dashboard 1600 may be located to correspond to a passenger seat. In an embodiment, the cluster 1400 may be adjacent to the first side window glass 1110, and the passenger seat dashboard 1600 may be adjacent to the second side window glass 1120.

In an embodiment, the display apparatus 1 may include the display panel 10, and the display panel 10 may display an image. The display apparatus 1 may be located inside the vehicle 1000. In an embodiment, the display apparatus 1 may be located between the side window glasses 1100 facing each other. The display apparatus 1 may be located on at least one of the cluster 1400, the center fascia 1500, and the passenger seat dashboard 1600.

Examples of the display apparatus 1 may include a liquid-crystal display, an electrophoretic display, an organic light-emitting display, an inorganic light-emitting display, a field-emission display, a surface-conduction electron-emitter display, a quantum dot display, a plasma display, and a cathode ray display. Although an organic light-emitting display apparatus is used as the display apparatus 1 according to an embodiment, any of various display apparatuses as described above may be used.

Referring to FIG. 12A, the display apparatus 1 may be located on the center fascia 1500. In an embodiment, the display apparatus 1 may display navigation information. In an embodiment, the display apparatus 1 may display information about an audio, a video, or vehicle settings.

In an embodiment, light emitted by the display apparatus 1 may travel in a specific direction. For example, light emitted by the display apparatus 1 may travel to the driver seat (not shown). Light emitted by the display apparatus 1 may travel to the passenger seat (not shown). As a viewing angle is controlled to be 30° or less, light emitted by the display apparatus 1 may not travel to the front window glass 1200. When light emitted by the display apparatus 1 travels to the front window glass 1200, the light emitted by the display apparatus 1 may be reflected by the front window glass 1200 to the driver seat. Accordingly, a driver may perceive an image of the display apparatus 1 formed on the front window glass 1200 and may not perceive an object ahead, thereby causing safety problems during driving. In an embodiment, however, light emitted by the display apparatus 1 located on the center fascia 1500 may travel within a viewing angle of 30° or less. Accordingly, according to an embodiment, light traveling to the front window glass 1200 may be minimized.

Referring to FIG. 12B, the display apparatus 1 may be located in the cluster 1400. In this case, the cluster 1400 may display driving information by using the display apparatus 1. That is, the cluster 1400 may operate in a digital manner. The cluster 1400 operating in a digital manner may display vehicle information and driving information as images. For example, needles and gauges of the tachometer and various warning light icons may be displayed by using digital signals.

In an embodiment, light emitted by the display apparatus 1 may travel in a specific direction. For example, light emitted by the display apparatus 1 may travel to the driver seat (not shown). As a viewing angle is controlled to be 30° or less, light emitted by the display apparatus 1 may not travel to the front window glass 1200.

As a viewing angle is controlled to be 30° or less, light emitted by the display apparatus 1 may not travel to the first side window glass 1110. When light emitted by the display apparatus 1 travels to the first side window glass 1110, the light emitted by the display apparatus 1 may be reflected by the first side window glass 1110 to the driver seat. Accordingly, the driver may perceive an image of the display apparatus 1 formed on the first side window glass 1110, and the driver may not clearly see the side mirror 1300 located outside the first side window glass 1110, thereby causing safety problems during driving. In an embodiment, however, because a viewing angle is controlled to be 30° or less, light emitted by the display apparatus 1 located in the cluster 1400 may travel in a specific direction. Accordingly, light traveling to the front window glass 1200 or the first side window glass 1110 may be minimized.

Referring to FIG. 12C, the display apparatus 1 may be located on the passenger seat dashboard 1600. The display apparatus 1 may be embedded in the passenger seat dashboard 1600 or may be located on the passenger seat dashboard 1600. In an embodiment, the display apparatus 1 located on the passenger seat dashboard 1600 may display an image related to information displayed on the cluster 1400 or information displayed on the center fascia 1500. In another embodiment, the display apparatus 1 located on the passenger seat dashboard 1600 may display information different from information displayed on the cluster 1400 or information displayed on the center fascia 1500.

In an embodiment, light emitted by the display apparatus 1 may travel in a specific direction. For example, light emitted by the display apparatus 1 may travel to the passenger seat (not shown). In another example, light emitted by the display apparatus 1 may not travel to the driver seat (not shown). In another example, as a viewing angle is controlled to be 30° or less, light emitted by the display apparatus 1 may not travel to the second side window glass 1120. When light emitted by the display apparatus 1 travels to the second side window glass 1120, the light emitted by the display apparatus 1 may be reflected by the second side window glass 1120 to the driver seat. Accordingly, the driver may perceive an image of the display apparatus 1 formed on the second side window glass 1120, and the driver may not clearly see the side mirror 1300 located outside the second side window glass 1120, thereby causing safety problems during driving. In an embodiment, however, light emitted by the display apparatus 1 located on the passenger seat dashboard 1600 may travel within a viewing angle of 30° or less. Accordingly, light traveling to the second side window glass 1120 may be minimized.

In some embodiments, light emitted by the display apparatus 1 located on the passenger seat dashboard 1600 may not travel to the front window glass 1200. Accordingly, the driver's forward vision may not be obstructed by the display apparatus 1 located on the passenger seat dashboard 1600.

As described above, according to an embodiment, when a display panel is mounted on a means of transportation such as a vehicle, emitted light may travel within a specific viewing angle. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display panel comprising:
a substrate;
a first light blocking line, a second light blocking line, and a third light blocking line located on the substrate, extending in a first direction in a plan view, and spaced apart from one another in a second direction that intersects the first direction;
a first display element and a second display element located between the first light blocking line and the second light blocking line and respectively emitting light of a first color and light of a second color; and
a third display element located between the second light blocking line and the third light blocking line and emitting light of a third color,
wherein, in a plan view, a first width of each of a first emission area of the first display element, a second emission area of the second display element, and a third emission area of the third display element in the first direction is greater than a second width of each of the first emission area of the first display element, the second emission area of the second display element, and the third emission area of the third display element in the second direction,
wherein the first display element and the second display element are not separated by a light blocking line,
wherein the first light blocking line is adjacent to the second light blocking line in the second direction crossing the first direction,
wherein the second light blocking line is adjacent to the third light blocking line in the second direction, and

wherein the first light blocking line is directly adjacent to the second light blocking line and the second light blocking line is directly adjacent to the third light blocking line.

2. The display panel of claim 1, wherein the second widths of the first emission area, the second emission area, and the third emission area in the second direction are same.

3. The display panel of claim 1, wherein, when viewed from a user's viewpoint, the first direction is a row direction and the second direction is a column direction.

4. The display panel of claim 1, wherein the first light blocking line, the second light blocking line, and the third light blocking line are included within a light blocking control layer located over the first display element, the second display element, and the third display element, and
wherein the light blocking control layer comprises: a plurality of light blocking pattern layers; and a plurality of insulating layers alternately located with the plurality of light blocking pattern layers.

5. The display panel of claim 4, wherein the plurality of insulating layers comprise a light-transmitting organic material.

6. The display panel of claim 4, wherein a thickness of the light blocking control layer is proportional to the second width.

7. The display panel of claim 4, wherein the plurality of light blocking pattern layers respectively comprise openings corresponding to the first emission area, the second emission area, and the third emission area,
wherein two adjacent insulating layers from among the plurality of insulating layers contact each other through the opening.

8. The display panel of claim 1, wherein, in a plan view, a shape of each of the first emission area, the second emission area, and the third emission area is a quadrangular shape.

9. The display panel of claim 1, wherein the first color is red, the second color is green, and the third color is blue.

10. The display panel of claim 1, wherein, in a plan view, a size of the third emission area is greater than a size of the first emission area and a size of the second emission area.

11. The display panel of claim 1, further comprising:
a fourth light blocking line and a fifth light blocking line extending in the first direction and spaced apart from the third light blocking line in the second direction;
a fourth display element and a fifth display element located between the third light blocking line and the fourth light blocking line and respectively emitting light of the first color and light of the second color; and
a sixth display element located between the fourth light blocking line and the fifth light blocking line and emitting light of the third color.

12. The display panel of claim 11, further comprising a first pixel circuit, a second pixel circuit, and a third pixel circuit located on the substrate,
wherein the first pixel circuit is electrically connected to the first display element and the fourth display element,
the second pixel circuit is electrically connected to the second display element and the fifth display element, and
the third pixel circuit is electrically connected to the third display element and the sixth display element.

13. The display panel of claim 11, wherein the fourth display element is controlled in a same manner as the first display element, the fifth display element is controlled in a same manner as the second display element, and the sixth display element is controlled in a same manner as the third display element.

14. The display panel of claim 11, wherein, in a plan view, a third width of each of a fourth emission area of the fourth display element, a fifth emission area of the fifth display element, and a sixth emission area of the sixth display element in the first direction is greater than a fourth width of each of the fourth emission area of the fourth display element, the fifth emission area of the fifth display element, and the sixth emission area of the sixth display element in the second direction.

15. The display panel of claim 14, wherein the second width and the fourth width are same.

16. The display panel of claim 14, further comprising a light blocking control layer located over the first display element through the sixth display element, wherein the light blocking control layer comprises: a plurality of light blocking pattern layers; and a plurality of insulating layers alternately located with the plurality of light blocking pattern layers, wherein the first light blocking line through the fifth light blocking line respectively correspond to at least some of the plurality of light blocking pattern layers.

17. The display panel of claim 16, wherein a thickness of the light blocking control layer is proportional to the fourth width.

18. The display panel of claim 16, further comprising:

a thin film encapsulation layer located on the first display element, the second display element, and the third display element; and an anti-reflection layer located on the light blocking control layer.

19. The display panel of claim 18, wherein the light blocking control layer is located on the thin film encapsulation layer.

20. The display panel of claim 1, wherein a viewing angle of the light emitted by each of the first display element, the second display element, and the third display element is equal to or less than 30°.

\* \* \* \* \*